US012810043B2

(12) United States Patent
Smith

(10) Patent No.: US 12,810,043 B2
(45) Date of Patent: Nov. 24, 2026

(54) INCREASE SIMULATOR PERFORMANCE USING MULTIPLE MESH FIDELITIES FOR DIFFERENT SENSOR MODALITIES

(71) Applicant: GM Cruise Holdings LLC, San Francisco, CA (US)

(72) Inventor: Kyle Smith, Frankfort, IL (US)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 1032 days.

(21) Appl. No.: 18/059,084

(22) Filed: Nov. 28, 2022

(65) Prior Publication Data

US 2024/0176930 A1 May 30, 2024

(51) Int. Cl.
*G06F 30/23* (2020.01)

(52) U.S. Cl.
CPC .................................... *G06F 30/23* (2020.01)

(58) Field of Classification Search
CPC ................................ G06F 30/23; G06F 30/15
See application file for complete search history.

(56) References Cited

U.S. PATENT DOCUMENTS

2019/0302259 A1* 10/2019 Van Fleet ............... G01S 17/86

OTHER PUBLICATIONS

Ang, Jun Wei Dickson, et al. "Big data scenarios simulator for deep learning algorithm evaluation for autonomous vehicle." GLOBECOM 2020-2020 IEEE Global Communications Conference. IEEE, 2020. (Year: 2020).*

Claypool, Mark, "The Game Development Process", "Visual Design and Production", Lecture Notes from Worcester Polytechnic Institute. 2006. URL: web(dot)cs(dot)WPI(dot)edu/~imgd1001/e06/ (Year: 2006).*

Davar, Sherry Alldén, et al. "Virtual generation of lidar data for autonomous vehicles." (2017). Bachelor's Thesis. University of Gothenburg. Chalmers University of Technology. (Year: 2017).*

DeCoro, Christopher, and Natalya Tatarchuk. "Real-time mesh simplification using the GPU." Proceedings of the 2007 symposium on Interactive 3D graphics and games. 2007. (Year: 2007).*

Del Egido Sierra, Javier, et al. "Autonomous vehicle control in CARLA challenge." Transportation research procedia 58 (2021): 69-74 (Year: 2021).*

(Continued)

*Primary Examiner* — David A Hopkins
(74) *Attorney, Agent, or Firm* — CANTOR COLBURN LLP

(57) ABSTRACT

Systems and methods using different mesh fidelities for different sensor modalities in a vehicle simulation are provided. For instance, a computer-implemented system includes one or more processing units; and one or more non-transitory computer-readable media storing instructions, when executed by the one or more processing units, cause the one or more processing units to perform operations including generating synthetic sensor data based on low-fidelity mesh data representing an object; generating a synthetic driving scene including the object, the generating the synthetic driving scene is based at least in part on high-fidelity mesh data representing the object; and executing a vehicle compute process based on the synthetic driving scene and the synthetic sensor data.

20 Claims, 6 Drawing Sheets

(56) References Cited

OTHER PUBLICATIONS

Epic Games, “The Automative Field Guide”, “Building an Open Automotive Platform and Data Model With Unreal Engine”, 2020, URL: cdn2(dot)unrealengine(dot)com/automotive-field-guide-v1-1-683681366(dot)pdf. (Year: 2020).*
Gao, Xifeng, Kui Wu, and Zherong Pan. “Low-poly mesh generation for building models.” ACM SIGGRAPH 2022 Conference Proceedings. 2022. (Year: 2022).*
Gómez-Huélamo, Carlos, et al. “Train here, drive there: Simulating real-world use cases with fully-autonomous driving architecture in carla simulator.” Workshop of Physical Agents. Cham: Springer International Publishing, 2020 (Year: 2020).*
Guerra, Winter, et al. “Flightgoggles: Photorealistic sensor simulation for perception-driven robotics using photogrammetry and virtual reality.” 2019 IEEE/RSJ International Conference on Intelligent Robots and Systems (IROS). IEEE, 2019. (Year: 2019).*
Hu, Yuchao, and Wei Meng. “ROSUnitySim: Development and experimentation of a real-time simulator for multi-unmanned aerial vehicle local planning.” Simulation 92.10 (2016): 931-944. (Year: 2016).*
Isteník, Matej. “Large boss characters in Unity engine: Reimplementation of gameplay mechanics from Shadow of the Colossus video game.” (2015). (Year: 2015).*
Jayaraman, Arvind, Ashley Micks, and Ethan Gross. Creating 3d virtual driving environments for simulation-aided development of autonomous driving and active safety. No. 2017-01-0107. SAE Technical Paper, 2017 (Year: 2017).*
Joisher, Karan, Suhaib Khan, and Omkar Ranadive. “Simulation Environment for Development and Testing of Autonomous Learning Agents.” 2nd International Conference on Advances in Science & Technology (ICAST). 2019. (Year: 2019).*
Kanakagiri, Abhishek. Development of a virtual simulation environment for autonomous driving using digital twins. Diss. Technische Hochschule Ingolstadt, 2021 (Year: 2021).*
Luebke, David. “Level of Detail: A Brief Overview”. Lecture Notes from Unviersity of Virgina. CompSci 344, Spring 2015 (Year: 2015).*
Manivasagam, Sivabalan, et al. “Lidarsim: Realistic lidar simulation by leveraging the real world.” Proceedings of the IEEE/CVF Conference on Computer Vision and Pattern Recognition. 2020. (Year: 2020).*
Meng, Wei, et al. “ROS+ unity: An efficient high-fidelity 3D multi-UAV navigation and control simulator in GPS-denied environments.” IECON 2015—41st Annual Conference of the IEEE Industrial Electronics Society. IEEE, 2015. (Year: 2015).*
Orangemittens, “How to Reduce Mesh Poly Count”, Forum Post on Sims 4 studio forum, Mar. 23, 2015. URL: sims4studio(dot)com/thread/1031/reduce-mesh-poly-count (Year: 2015).*
Pajarola, Renato. “Advanced 3D Computer Graphics.” (2000). University of California Irvine. URL web(dot)mat(dot)upc(dot)edu/toni(dot)susin/files/IntroductionComputerGraphicsRenato(dot)pdf (Year: 2000).*
Patel, Parth Hasmukhbhai. Development of 3D simulation environment for testing and calibration of autonomous vehicles. Diss. Technische Hochschule Ingolstadt, 2021. Release date: Mar. 28, 2023. (Year: 2023).*
Rivero, Jose Roberto Vargas, et al. “The effect of spray water on an automotive LIDAR sensor: A real-time simulation study.” IEEE Transactions on Intelligent Vehicles 7.1 (2021): 57-72. (Year: 2021).*
Vukić, Matija, et al. “Unity based urban environment simulation for autonomous vehicle stereo vision evaluation.” 2019 42nd International Convention on Information and Communication Technology, Electronics and Microelectronics (MIPRO). IEEE, 2019. (Year: 2019).*
Wagener, Nicolas, Jobst Beckmann, and Lutz Eckstein. “Efficient Creation of 3D-Virtual Environments for Driving Simulators.” 2022 International Conference on Electrical, Computer, Communications and Mechatronics Engineering (ICECCME). IEEE, 2022 (Year: 2022).*
Won, Minseok, and Shiho Kim. “Simulation Driven Development Process Utilizing Carla Simulator for Autonomous Vehicles.” SIMULTECH. 2022 (Year: 2022).*
Yilmaz, Erdal. 2020. Radar Sensor Plugin for Game Engine Based Autonomous Vehicle Simulators. Master’s thesis, Harvard Extension School. (Year: 2020).*
CARLA, User Guide, for version 0.9.10 (dated Sep. 25, 2020 per revision log) of CARLA, URL: carla(dot)readthedocs(dot)io/en/0(dot)9(dot)10/ (Year: 2020).*
Bonet, “Level of Detail (LOD): Quick Tutorial”, Blog Post, Jun. 18, 2021. URL: gamedeveloper(dot)com/programming/level-of-detail-lod-quick-tutorial (Year: 2021).*

* cited by examiner

INCREASE SIMULATOR PERFORMANCE USING MULTIPLE MESH FIDELITIES FOR DIFFERENT SENSOR MODALITIES

BACKGROUND

1. Technical Field

The present disclosure generally relates to autonomous vehicles and, more specifically, to using different mesh fidelities for different sensor modalities in an autonomous driving simulation.

2. Introduction

Autonomous vehicles, also known as self-driving cars, driverless vehicles, and robotic vehicles, may be vehicles that use multiple sensors to sense the environment and move without human input. Automation technology in the autonomous vehicles may enable the vehicles to drive on roadways and to accurately and quickly perceive the vehicle's environment, including obstacles, signs, and traffic lights. Autonomous technology may utilize map data that can include geographical information and semantic objects (such as parking spots, lane boundaries, intersections, crosswalks, stop signs, traffic lights) for facilitating the vehicles in making driving decisions. The vehicles can be used to pick up passengers and drive the passengers to selected destinations. The vehicles can also be used to pick up packages and/or other goods and deliver the packages and/or goods to selected destination.

BRIEF DESCRIPTION OF THE DRAWINGS

The various advantages and features of the present technology will become apparent by reference to specific implementations illustrated in the appended drawings. A person of ordinary skill in the art will understand that these drawings show only some examples of the present technology and would not limit the scope of the present technology to these examples. Furthermore, the skilled artisan will appreciate the principles of the present technology as described and explained with additional specificity and detail through the use of the accompanying drawings in which.

DETAILED DESCRIPTION

Figure 1:
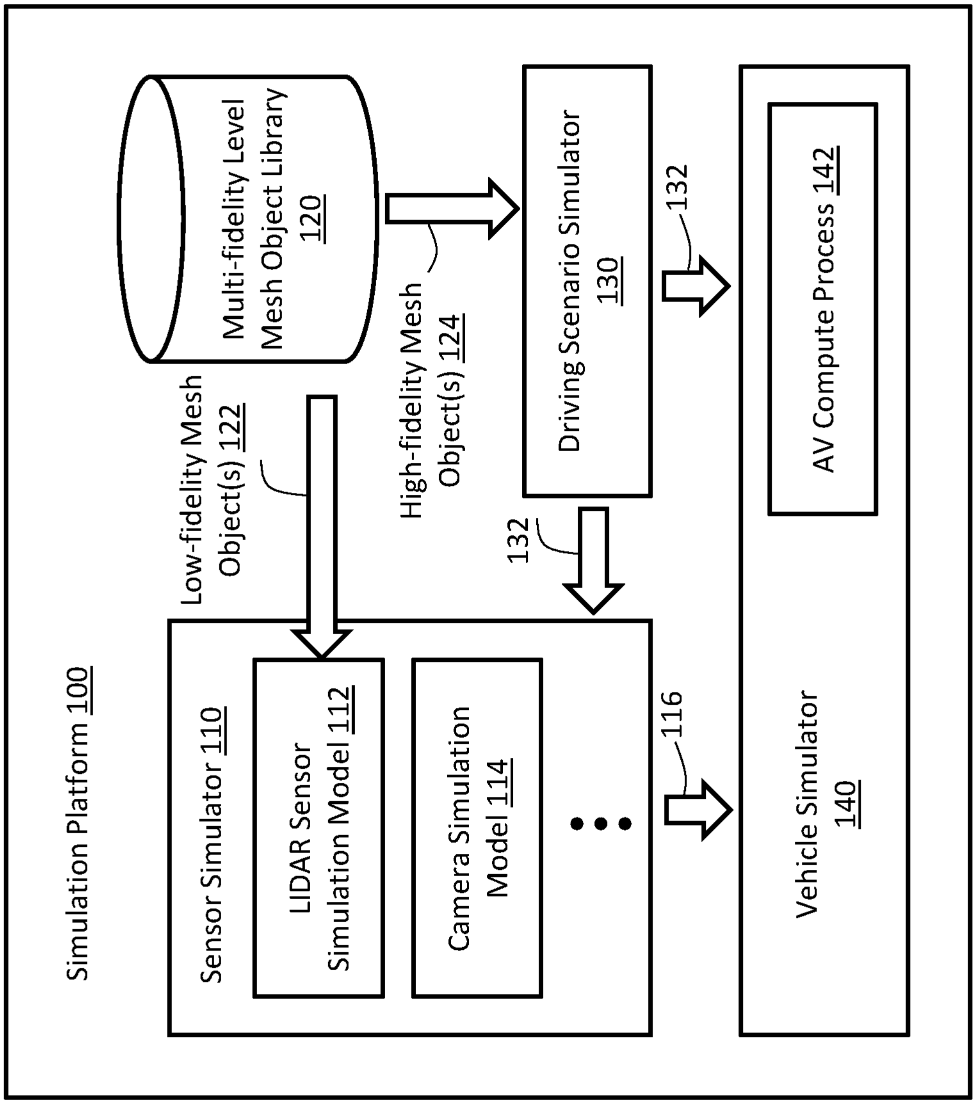
FIG. 1 illustrates an exemplary autonomous vehicle (AV) simulation platform using mesh objects of different fidelity levels, according to some embodiments of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these details. In some instances, structures and components are shown in block diagram form to avoid obscuring the concepts of the subject technology.

Autonomous vehicles (AVs) can provide many benefits. For instance, AVs may have the potential to transform urban living by offering opportunities for efficient, accessible and affordable transportation. An AV may be equipped with various sensors to sense an environment surrounding the AV and collect information (e.g., sensor data) to assist the AV in making driving decisions. To that end, the collected information or sensor data may be processed and analyzed to determine a perception of the AV's surroundings, extract information related to navigation, and predict future motions of the AV and/or other traveling agents in the AV's vicinity. The predictions may be used to plan a path for the AV (e.g., from a starting position to a destination). As part of planning, the AV may access map information and localize itself based on location information (e.g., from location sensors) and the map information. Subsequently, instructions can be sent to a controller to control the AV (e.g., for steering, accelerating, decelerating, braking, etc.) according to the planned path.

The operations of perception, prediction, planning, and control of an AV may be implemented using a combination of hardware and software components. For instance, an AV stack or AV compute process performing the perception, prediction, planning, and control may be implemented using one or more of software code and/or firmware code. However, in some embodiments, the software code and firmware code may be supplemented with hardware logic structures to implement the AV stack and/or AV compute process. The AV stack or AV compute process (the software and/or firmware code) may be executed on processor(s) (e.g., general purpose processors, central processing units (CPUs), graphical processing units (GPUs), digital signal processors (DSPs), application specific integrated circuits (ASICs), etc.) and/or any other hardware processing components on the AV. Additionally, the AV stack or AV compute process may communicate with various hardware components (e.g., onboard sensors and control systems of the AV) and/or with an AV infrastructure over a network.

Training and testing AVs in the physical world can be challenging. For instance, to provide good testing coverage, an AV may be trained and tested to respond to various driving scenarios (e.g., millions of physical road test scenarios) before it can be deployed in an unattended, real-life roadway system. As such, it may be costly and time-consuming to train and test AVs on physical roads. Further, there may be test cases that are difficult to create or too dangerous to cover in the physical world. Accordingly, it may be desirable to train and validate AVs in a simulation environment.

A simulator may simulate (or mimic) real-world conditions (e.g., roads, lanes, buildings, obstacles, other traffic participants, trees, lighting conditions, weather conditions, etc.) so that the AV stack and/or AV compute process of an AV may be tested in a virtual environment that is close to a real physical world. Testing AVs in a simulator can be more efficient and allow for creation of specific traffic scenarios and/or specific road objects. To that end, the AV compute process implementing the perception, prediction, planning, and control algorithms can be developed, validated, and fine-tuned in a simulation environment. More specifically, sensors on an AV used for perception of a driving environment can be modeled in an AV simulator, the AV compute process may be executed in the AV simulator, and the AV simulator may compute metrics related to AV driving decisions, AV response time, etc. to determine the performance of an AV to be deployed with the AV compute process.

In some examples, an AV simulator may utilize a sensor simulation model to generate synthetic sensor data of a synthetic driving scene. The sensor simulation model may be a physics-based sensor simulation model. A physics-based sensor simulation model may be a mathematical or signal processing model that generates sensor data or sensor return signals closely resembling sensor data or returns signals produced by an actual physical sensor. As an example, the sensor simulation model may be a camera simulation model that simulates physical properties, for example, including but not limited to, an update rate, an image width, an image height, a field of view (FOV), a sensor lag, an exposure time, and lens type, etc., of a certain camera. The camera simulation model may generate a synthetic image of a synthetic driving scene that can closely resemble a real image produced by the real camera, for example, in terms of resolution, colors, and intensities, etc. As another example, the sensor simulation model may be a light detection and ranging (LIDAR) sensor simulation model that simulates physical properties, for example, including but limited to, an update rate, a beam characteristic, a resolution, a range characteristic, a scan frequency/angle, horizontal and vertical FOVs, blind spot, and/or LIDAR head movements, of a certain LIDAR sensor. The LIDAR sensor simulation model may generate a synthetic LIDAR point cloud (or LIDAR return signals) that can closely resemble a real LIDAR point cloud produced by the real LIDAR sensor, for example, in terms of intensities, densities, distributions, etc. The physics calculations for a LIDAR sensor may be significantly more complex than for a camera. Accordingly, in some examples, the LIDAR sensor simulation may be unable to meet real-time requirements, meaning that the LIDAR sensor simulation cannot generate a synthetic LIDAR point cloud fast enough to enable an AV compute process to calculate a perception, prediction, path, or control operation in real-time. One approach to meeting the real-time requirement is to allocate and utilize more computation resources (e.g., more processors and/or more powerful processors) for LIDAR sensor simulation, but this may be undesirable as the cost may increase. Another approach is to allow the AV simulation to take a longer time to run, but this may also be undesirable as it may lower AV simulation performance (e.g., increasing time for AV algorithms and/or software training, development, testing, and/or integration). Accordingly, there is a need to increase AV simulation performance without increasing the cost.

The present disclosure provides techniques to increase AV simulation performance by generating sensor data of different sensing modalities from mesh data of different mesh fidelities. A mesh is a collection of vertices, edges, and faces that describe the shape of a three-dimensional (3D) object, where a vertex is a single point, an edge is a straight line segment connecting two vertices, and a face is a flat surface enclosed by edges and can be of any shape (e.g., a triangle or generally a polygon). In an AV simulation, a mesh object (a 3D mesh object) may be created to represent a certain character, a road user, or generally, any object in a synthetic driving environment. That is, a synthetic object can be created in the form of a mesh (mesh object or mesh data) and can be placed in any suitable location in a synthetic driving environment. Mesh data of a higher fidelity level may have a greater number of vertices, faces, edges, and/or polygons than mesh data of a lower fidelity. In general, high-fidelity mesh data may have a higher fidelity (e.g., more accurate and/or more detailed) in representing a certain object than low-fidelity mesh data but may take more processing power (or a longer time) to process than the low-fidelity mesh data.

According to aspects of the present disclosure, synthetic sensor data of different sensing modalities can be generated from mesh data of different mesh fidelities based on the computational complexities of respective sensor simulation models. To that end, mesh data of different mesh fidelities may be generated for the same object, where a sensor simulation model having a higher computational complexity may select or utilize the mesh data with a lower fidelity to generate respective sensor data. In this way, the performance of an AV simulation may not be impacted and no additional computation resource may be required when the simulation includes a high-complexity sensor simulation model. Further, the decimation (or conversion) of high-fidelity mesh data to low-fidelity mesh data can be based on various tuning or configuration parameters so that the low-fidelity mesh data may have sufficient details or features (e.g., in terms of shapes, profiles, and/or contours) to enable accurate object identification by an AV perception process. The present disclosure may use the terms “synthetic.” “virtual,” and “simulated” interchangeably to refer to any data and/or objects that are generated or calculated using software model(s).

According to an aspect of the present disclosure, a computer-implemented system may provide a virtual driving environment for vehicle software training, development, testing, and/or integration. For example, the computer-implemented system may generate synthetic sensor data based on low-fidelity mesh data representing an object. The computer-implemented system may further generate a synthetic driving scene including the object. The synthetic driving scene may be generated based at least in part on high-fidelity mesh data representing the object. The computer-implemented system may execute a vehicle compute process based on the synthetic driving scene and the synthetic sensor data.

In some aspects, the low-fidelity mesh data includes a smaller number of at least one of vertices, faces, bones, or polygons than the high-fidelity mesh data. In some aspects, the smaller number of the at least one of vertices, faces, bones, or polygons of the low-fidelity mesh data may be based on a characteristic of the object (e.g., by configuring a certain tuning parameter for a decimation process that generate the low-fidelity mesh data from the high-fidelity mesh data). As an example, the object may be a human (e.g., a pedestrian), and the low-fidelity mesh data may include a sufficient number of vertices, faces, bones, and/or polygons to show the profile, shape, contour, or outline (e.g., in the form of a silhouette) of a human.

In some aspects, as part of generating the synthetic sensor data, the computer-implemented system may generate synthetic LIDAR return signals based on the low-fidelity mesh data representing the object. In this regard, the computer-implemented system may utilize a LIDAR sensor simulation model (e.g., a physics-based LIDAR sensor simulation model) to process the low-fidelity mesh data and generate the LIDAR return signals. In some instances, the LIDAR sensor simulation model may be computationally intensive. Using the low-fidelity mesh data for synthetic LIDAR return signal generation can thus enable the AV simulation to execute in real-time. In some aspects, the computer-implemented system may further generate a synthetic image of the synthetic driving scene based at least in part on the high-fidelity mesh data representing the object, for example, by using a camera sensor simulation model to process the high-fidelity mesh data.

The vehicle compute process may simulate operation(s) and/or behavior(s) of a synthetic vehicle driving in the synthetic driving scene. Accordingly, as part of executing the vehicle compute process, the computer-implemented system may determine at least one of a perception, a prediction, a driving path, or a vehicle control operation based on the synthetic sensor data and the synthetic driving scene. In certain aspects, the computer-implemented system may detect and/or identify the object from the synthetic driving scene based on the synthetic sensor data generated from the low-fidelity mesh data and may determine at least one of the perception, prediction, driving path, or vehicle control operation based on the identified object and a synthetic image of the synthetic driving scene, where the synthetic image may be generated from the high-fidelity mesh data.

In some aspects, the computer-implemented system may further read, from a mesh object library (e.g., a multi-fidelity level mesh object library), the high-fidelity mesh data and the low-fidelity mesh data. In some aspects, the computer-implemented system may further include a memory to store the mesh object library, where the mesh object library may include a high-fidelity mesh object library including the high-fidelity mesh data and a low-fidelity mesh object library including the low-fidelity mesh data.

In some aspects, the computer-implemented system may include at least one central processing unit (CPU) and at least one at least one graphical processing unit (GPU), where the generation of the synthetic sensor data may be performed by the CPU and the generation of the synthetic driving scene may be performed by the GPU.

In some aspects, the synthetic driving scene may be generated based on real-world road data captured from a real-world driving environment. In other aspects, the synthetic driving scene may be generated based on certain a driving scene or use case definition, for example, where a virtual roadway system may be generated, and synthetic or virtual roadside objects may be placed in the virtual roadway system according to various configuration parameters.

The systems, schemes, and mechanisms described herein can advantageously increase the performance of an AV simulation by generating sensor data of different sensing modalities from mesh data of different fidelities. For instance, using lower fidelity mesh data for a sensor simulation model with a higher computational complexity can allow an AV simulation to execute in real-time without impacting cost and/or increasing time for training, testing, and/or integration. Further, tuning a decimation process for creating low-fidelity mesh data from high-fidelity mesh data can allow for an optimal performance where the computation complexity can be reduced without impacting object identification performance.

FIG. 1 illustrates an exemplary AV simulation platform 100 using mesh objects of different fidelity levels, according to some embodiments of the present disclosure. The simulation platform 100 may be used for testing and validation of AV algorithms, machine learning (ML) models, and/or neural networks used by AV compute software (e.g., an AV compute process 142), and various other development efforts for the AV compute software. The AV compute software may be deployed in a real AV (a physical AV) for driving in a physical real-world roadway system.

At a high level, an AV (e.g., the AV of FIG. 6) may be equipped with onboard sensors to sense a surrounding environment of the AV. The AV may also be equipped with an onboard computer to interpret the sensing data output by the sensors and appropriately react to the surrounding environment. In this regard, the onboard computer may execute the AV compute software, which may perform the tasks of perception, prediction, path planning, and control to maneuver or drive the AV on the roads.

The sensors may include a wide variety of sensors, which may broadly categorize into a computer vision ("CV") system, localization sensors, and driving sensors. As an example, the AV's sensors may include one or more cameras. The one or more cameras may capture images of the surrounding environment of the AV. In some instances, the sensor may include multiple cameras to capture different views, e.g., a front-facing camera, a back-facing camera, and side-facing cameras. In some instances, one or more cameras may be implemented using a high-resolution imager with a fixed mounting and FOV. One or more cameras may have adjustable FOVs and/or adjustable zooms. In some embodiments, the cameras may capture images continually or at some intervals during operation of the AV. The cameras may transmit the captured images to the onboard computer for further processing, for example, to assist the AV in determining certain action(s) to be carried out by the AV.

Additionally or alternatively, the AV's sensors may include one or more LIDAR sensors. The one or more LIDAR sensors may measure distances to objects in the vicinity of the AV using reflected laser light. The one or more LIDAR sensors may include a scanning LIDAR that provides a point cloud of the region scanned. The one or more LIDAR sensors may have a fixed FOV or a dynamically configurable FOV. The one or more LIDAR sensors may produce a point cloud (e.g., a collection of data points in a 3D space) that describes the shape, contour, and/or various characteristics of one or more objects (e.g., buildings, trees, other vehicles, pedestrian, cyclist, road signs, etc.) in the surrounding of the AV and a distance of the object away from the AV. The one or more LIDAR sensors may transmit the captured point cloud to the onboard computer for further processing, for example, to assist the AV in determining certain action(s) to be carried out by the AV.

Additionally or alternatively, the AV's sensors may include one or more radio detection and ranging (RADAR) sensors. RADAR sensors may operate in substantially the same way as LIDAR sensors, but instead of the light waves used in LIDAR sensors, RADAR sensors use radio waves (e.g., at frequencies of 24, 74, 77, and 79 gigahertz (GHz)). The time taken by the radio waves to return from the objects or obstacles to the AV is used for calculating the distance, angle, and velocity of the obstacle in the surroundings of the AV.

Additionally or alternatively, the AV's sensors may include one or more location sensors. The one or more location sensors may collect data that is used to determine a current location of the AV. The location sensors may include a global positioning system (GPS) sensor and one or more inertial measurement units (IMUs). The one or more location sensors may further include a processing unit (e.g., a component of the onboard computer, or a separate processing unit) that receives signals (e.g., GPS data and IMU data) to determine the current location of the AV. The location determined by the one or more location sensors can be used for route and maneuver planning. The location may also be used to determine when to capture images of a certain object. The location sensor may transmit the determined location information to the onboard computer for further processing, for example, to assist the AV in determining certain action(s) to be carried out by the AV.

The onboard computer may have various hardware components (e.g., CPUs, GPUs, memory, etc.) to execute the AV compute software. For example, for perception, the AV compute software may analyze the collected sensor data (e.g., camera images, point clouds, location information, etc.) and output an understanding or a perception of the environment surrounding the AV. In particular, the AV compute software may extract, from the sensor data, information related to navigation and making driving decisions. For instance, the AV compute software may detect objects including, but not limited to, cars, pedestrians, trees, bicycles, and objects traveling on or near the roadway systems on which the AV is traveling. Further, in some examples, as part of performing the perception, the AV compute software may implement one or more classifiers (e.g., ML model(s) may be trained for classification) to identify particular objects. For example, a multi-class classifier may be used to classify each object in the environment of the AV as one of a set of potential objects, e.g., a vehicle, a pedestrian, or a cyclist. As another example, a pedestrian classifier may recognize pedestrians in the environment of the AV, a vehicle classifier may recognize vehicles in the environment of the AV, etc.

For prediction, the AV compute software may perform predictive analysis on at least some of the recognized objects, e.g., to determine projected pathways of other vehicles, bicycles, and pedestrians. The AV compute software may also predict the AV's future trajectories, which may enable the AV to make appropriate navigation decisions. In some examples, the AV compute software may utilize one or more prediction models (e.g., ML model(s)) to determine future motions and/or trajectories of other traffic agents and/or of the AV itself.

For AV planning, the AV compute software may plan maneuvers for the AV based on map data, perception data, prediction information, and navigation information, e.g., a route instructed by a fleet management system. In some examples, the AV compute software also receive map data from a map database (e.g., stored locally at the AV or at a remote server) including data describing roadways (e.g., locations of roadways, connections between roadways, roadway names, speed limits, traffic flow regulations, toll information, etc.), buildings (e.g., locations of buildings, building geometry, building types), and other objects (e.g., location, geometry, object type). In general, as part of planning, the AV compute software may determine a pathway for the AV to follow. When the AV compute software detects moving objects in the environment of the AV, the AV compute software may determine the pathway for the AV based on predicted behaviors of the objects provided by the prediction (e.g., computed by ML model(s)) and right-of-way rules that regulate behavior of vehicles, cyclists, pedestrians, or other objects. The pathway may include locations for the AV to maneuver to, and timing and/or speed of the AV in maneuvering to the locations.

For AV control, the AV compute software may send appropriate commands to instruct movement-related subsystems (e.g., actuators, steering wheel, throttle, brakes, etc.) of the AV to maneuver according to the pathway determined by the planning.

To enable the training, development, and/or validation of the AV compute software, the simulation platform 100 may include a combination of hardware and software components to implement a sensor simulator 110, a multi-fidelity level mesh object library 120, a driving scenario simulator 130, and a vehicle simulator 140. In certain aspects, the sensor simulator 110, the driving scenario simulator 130, and the vehicle simulator 140 may be software components. The simulation platform 100 may include various hardware components, for example, including but not limited to, CPU(s), GPU(s), memory, cloud resources, etc. The sensor simulator 110, the driving scenario simulator 130, and the vehicle simulator 140 may be executed by the CPU(s) and/or GPU(s). The multi-fidelity level mesh object library 120 may be stored at a memory of the simulation platform 100 or at a cloud storage over a network.

The driving scenario simulator 130 may generate a synthetic (or virtual) driving environment (e.g., synthetic driving environment data 132). The synthetic driving environment may be a graphical representation of a driving environment. In some examples, the synthetic driving environment can be a replica of a real-world driving environment, for example, based on real-world road data captured by an AV driving in a real-world road driving environment. In other examples, the synthetic driving environment can be created based on various configurations defined by users, for example. In some examples, the synthetic driving environment may include a 3D mesh defining a virtual 3D space. The virtual 3D space may include a synthetic roadway system (e.g., including synthetic streets, synthetic lanes, synthetic bridges, synthetic traffic lights, synthetic stop signs, synthetic crossings, synthetic road markings, synthetic road surfaces, etc.) and synthetic roadside objects or characters (e.g., including synthetic buildings, synthetic trees, synthetic vehicles, synthetic pedestrians, synthetic cyclists, etc.). The virtual 3D space may further include elements that simulate weather conditions, such as rain, fogs, snows, sunshine, etc. As will be discussed more fully below, the synthetic driving environment data 132 can be provided to the sensor simulator 110 and the vehicle simulator 140 for AV simulation.

The sensor simulator 110 may include a variety of sensor simulation models modeling sensors that may be onboard a real vehicle. The sensor simulation models may produce synthetic sensor data 116. The synthetic sensor data 116 may be used for developing, testing, and/or training various perception, prediction, path planning, and/or control algorithms of AV compute software. In some aspects, at least some of the sensor simulation models may be physics-based sensor simulation models. A physics-based sensor simulation model may have a mathematical or signal processing model that generates synthetic sensor data or sensor return signals closely resembling a sensor signal or data produced by a corresponding actual physical sensor. In the illustrated example of FIG. 1, the sensor simulator 110 may include a LIDAR sensor simulation model 112 and a camera simulation model 114. In various aspects, the sensor simulator 110 can include other sensor simulation models for other sensors, such as location sensors, driving sensors, etc. as discussed above.

In an aspect, the LIDAR sensor simulation model 112 may simulate physical properties and/or operations of a certain real LIDAR sensor. In this regard, the LIDAR sensor simulation model 112 may simulate, for example, an update rate, a beam characteristic, a resolution, a range characteristic, a scan frequency/angle, horizontal and vertical field of views (FOVs), a blind spot (a distortion), and/or LIDAR head movements of the real LIDAR sensor. For instance, data representing a synthetic object may be provided to the LIDAR sensor simulation model 112. The LIDAR sensor simulation model 112 may read the data. The LIDAR sensor simulation model 112 may generate a laser beam data set representative of laser beams emitted by the real LIDAR sensor. The LIDAR sensor simulation model 112 may calculate range data representative of a range of the laser beams. The LIDAR sensor simulation model 112 may generate a synthetic LIDAR point cloud or LIDAR return signals (e.g., as part of the synthetic sensor data 116) based on the read data (representative of the synthetic object) and the calculated range data, for example, using ray tracing technique or any suitable techniques known in the art. The synthetic LIDAR point cloud may resemble a real LIDAR point cloud generated by the real LIDAR sensor. For example, the synthetic LIDAR point cloud may replicate the intensities, densities, geospatial distributions, etc. of the real LIDAR point cloud.

In an aspect, the camera simulation model 114 may simulate physical properties and/or operations of a certain real camera. In this regard, the camera simulation model 114 may simulate, for example, an update rate, an image width, an image height, an FOV, a depth of view (DOV), a sensor lag, an exposure time, and lens type, etc., of the real camera. For instance, data representing a synthetic object or a synthetic driving scene may be provided to the camera simulation model 114. The camera simulation model 114 may read the data. The camera simulation model 114 may calculate lens data representative of lens at the real camera. The camera simulation model 114 may generate a synthetic image (e.g., as part of the synthetic sensor data 116) based on the read data (representative of the synthetic object or the synthetic driving scene) and the calculated lens data, for example, using ray tracing technique or any suitable techniques known in the art. The synthetic image may resemble a real image generated by the real camera. For example, the synthetic image may replicate the resolution, colors, and intensities, etc. of the real image.

The vehicle simulator 140 may simulate a synthetic vehicle driving in a synthetic driving environment. The vehicle simulator 140 may execute an AV compute process 142. The AV compute process 142 may be the same as an AV compute process (or AV compute software) that is to be deployed in a real AV. That is, the AV compute process 142 may implement AV perception, prediction, path planning, and control as discussed above in relation to the real AV. In an example, the sensor simulation models (e.g., the LIDAR sensor simulation model 112 and the camera simulation model 114) in the sensor simulator 110 may generate synthetic sensor data as if the sensor data is collected from sensors onboard the synthetic vehicle. The AV compute process 142 may receive the synthetic sensor data 116 from the sensor simulator 110 and the virtual driving environment data 132. The AV compute process 142 may perform perception, prediction, path planning, and/or control based on the synthetic sensor data 116 and the virtual driving environment data 132. In some aspects, the vehicle simulator 140 may also simulate vehicle motions, for example, velocity, drive torque, brake actuation, steering input, etc. The calculate dynamics of the synthetic vehicle may be fed back to the driving scenario simulator 130 so that driving scenario simulator 130 may update the synthetic driving scene accordingly.

Figure 2:
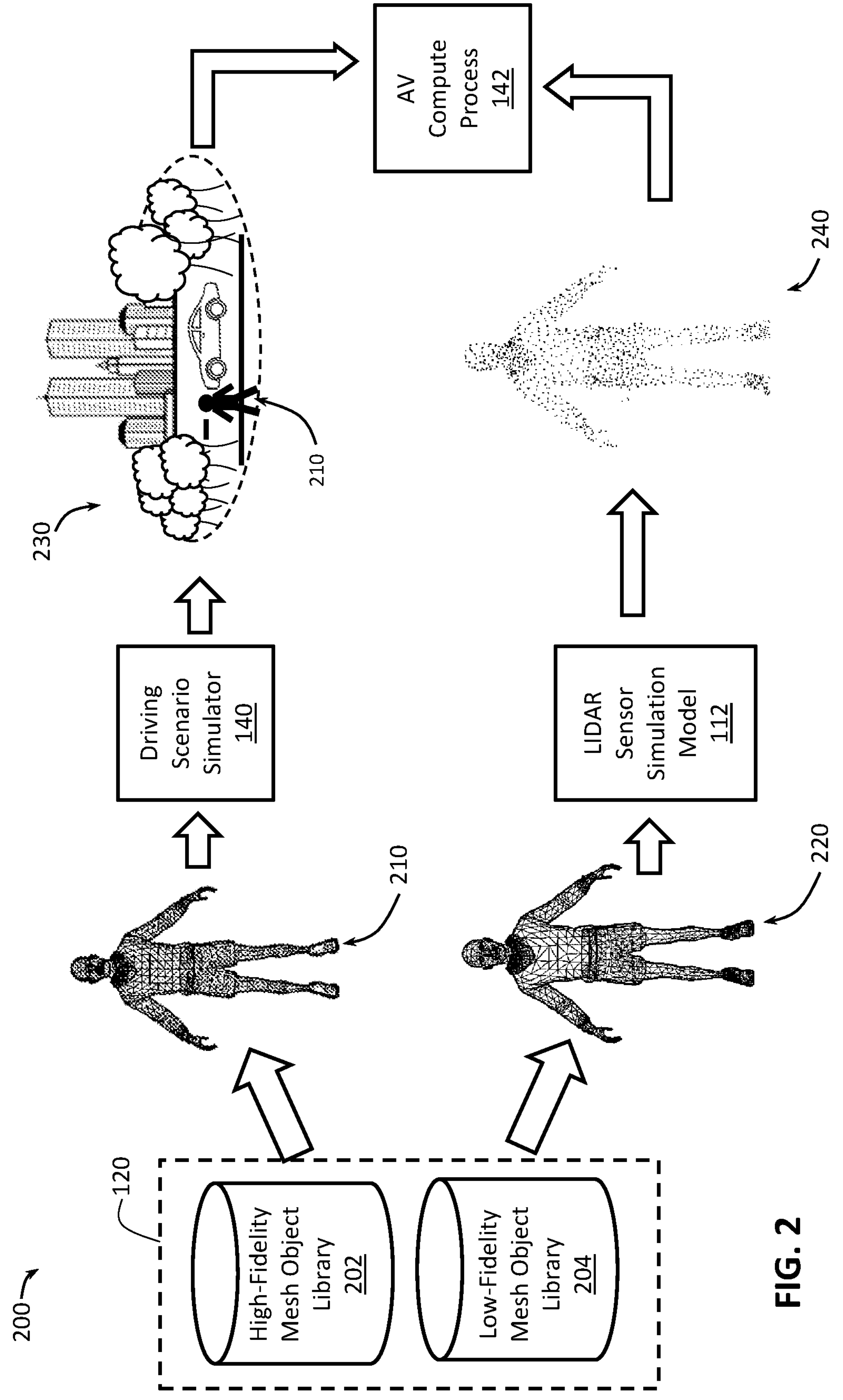
FIG. 2 illustrates an exemplary AV simulation scheme using mesh objects of different fidelity levels, according to some embodiments of the present disclosure.
Figure 3:
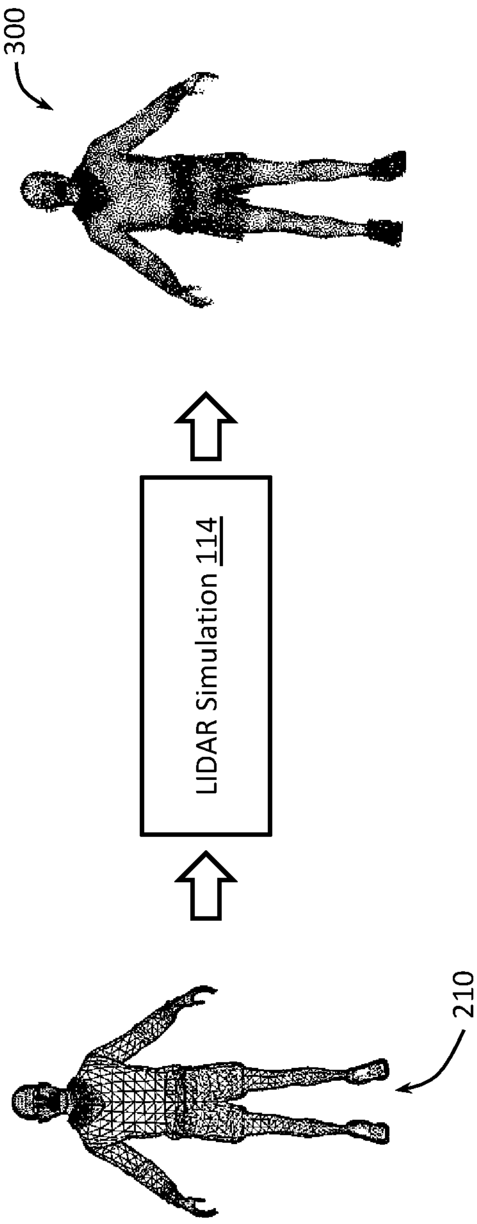
FIG. 3 illustrate an exemplary light detection and radar (LIDAR) data generated from a high-fidelity mesh object, according to some embodiments of the present disclosure.
Figure 4:
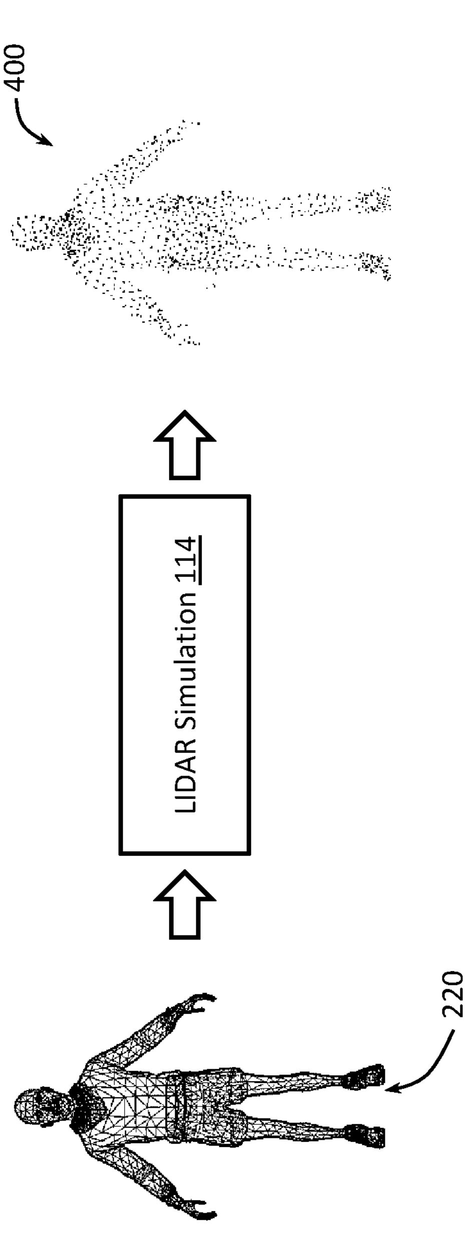
FIG. 4 illustrate an exemplary LIDAR data generated from a low-fidelity mesh object, according to some embodiments of the present disclosure.

The multi-fidelity level mesh object library 120 may include a variety of 3D mesh objects at various fidelity levels or granularities. As explained above, a mesh is a collection of vertices, edges, and faces that describe the shape of a 3D object, where a vertex is a single point, an edge is a straight line segment connecting two vertices, and a face is a flat surface enclosed by edges and can be of any shape (e.g., a polygon). A 3D mesh is a representation of the shape and/or textures of a respective 3D model of an object. The 3D mesh geometry is typically made up of hundreds, thousands, or even millions of points in a 3D space connected together to form small polygons (e.g., triangles or rectangles). The 3D mesh objects may generally be referred to as mesh data. The mesh data may be a data structure storing, for example, the vertices, edges, and/or faces of the polygons that made up the respective 3D mesh object. The 3D mesh objects in the multi-fidelity level mesh object library 120 may include any artifacts in a real-world roadway system, for example, including but not limited to, streets, virtual lanes, bridges, traffic lights, stop signs, crossings, road markings, buildings, trees, vehicles, pedestrians, cyclists, etc. In some instances, the multi-fidelity level mesh object library 120 may also include mesh objects of the same object type but with different sizes and/or different attributes. For instance, various mesh objects may model humans or pedestrians of different sizes, different heights, and/or different ages. Some examples of mesh objects are shown in FIGS. 2-4.

In some aspects, the multi-fidelity level mesh object library 120 may include mesh data of different fidelity levels for an individual object. As an example, the multi-fidelity level mesh object library 120 may include first mesh data representing a pedestrian and second mesh data representing the same pedestrian, where the first mesh data may have a higher fidelity level than the second mesh data. As another example, the multi-fidelity level mesh object library 120 may include third mesh data representing a cyclist and fourth mesh data representing the same cyclist, where the third mesh data may have a higher fidelity level than the fourth mesh data. As yet another example, the multi-fidelity level mesh object library 120 may include fifth mesh data representing a vehicle and sixth mesh data representing the same vehicle, where the fifth mesh data may have a higher fidelity level than the sixth mesh data. In certain aspects, the multi-fidelity level mesh object library 120 may include mesh data of two different fidelity levels for the same object. In general, the multi-fidelity level mesh object library 120 may include mesh data of any suitable number of fidelity levels (e.g., 3, 4 or more). Some examples of mesh objects with different fidelities are shown in FIGS. 2-4.

As explained above, mesh data of a higher fidelity level may have a higher count of vertices, faces, edges, and/or polygons than mesh data of a lower fidelity. Accordingly, in some examples, the high-fidelity mesh data can provide a better or more detailed representation of an object than the low-fidelity mesh data. However, the computational complexity for processing high-fidelity mesh data can be higher than for processing the low-fidelity mesh data.

In some instances, the computational complexity (e.g., the physics calculations) for the LIDAR sensor simulation model 112 may be high. As such, if the high-fidelity mesh data is fed to the LIDAR sensor simulation model 112 for generating synthetic LIDAR point clouds, the LIDAR sensor simulation model 112 may be unable to provide the synthetic LIDAR point clouds to the AV compute process 142 in real time. As an example, the driving scenario simulator 130 is capable of feeding virtual driving environment data to the AV compute process 142 in real time, and the AV compute process 142 is capable of processing the virtual driving environment data in real time. If the LIDAR sensor simulation model 112 cannot provide the synthetic LIDAR point cloud in real time, the AV compute process 142 may be stalled (e.g., waiting on the synthetic LIDAR point cloud to determine a perception of the virtual driving environment). As such, the simulation may take a longer timer, and can be undesirable as AV simulations may be run frequently for various software training, testing, and/or integration.

In order to increase simulation performance but without impacting cost (e.g., using more computation resources), the high-fidelity mesh data may be used by the driving scenario simulator 130 to generate a synthetic scene while the low-fidelity mesh data may be used by the LIDAR sensor simulation model 112 to generate synthetic LIDAR point clouds. Stated differently, using a hybrid mesh scheme with mesh objects of different fidelities, an AV simulation can be accelerated, for example, for real-time rendering.

As shown in FIG. 1, high-fidelity mesh data shown by the high-fidelity mesh objects 124 (e.g., 3D mesh objects) are provided to (or read by) the driving scenario simulator 130 while the low-fidelity mesh data shown by the low-fidelity mesh objects 122 (e.g., 3D mesh objects) are provided to (or read by) the LIDAR sensor simulation model 112. Accordingly, in an example, the AV compute process 142 may receive data for a synthetic driving scene generated by the driving scenario simulator 130 including a high-fidelity representation (e.g., a high-fidelity mesh object 124) of an object and may receive a synthetic LIDAR point cloud generated by the LIDAR sensor simulation model 112 based on a low-fidelity representation (e.g., a low-fidelity mesh object 122) of the same object. In some instances, the synthetic LIDAR point cloud may have data points corresponding to the vertices of the low-fidelity mesh data (e.g., triangular meshes). In a further aspect, because the computational complexity of the camera simulation model 114 may be relatively lower than the LIDAR sensor simulation model, the camera simulation model 114 may generate a synthetic image of the synthetic driving scene including high-fidelity mesh objects 124 and still meeting the real-time requirement of the simulation. As such, sensor simulation models of different sensing modalities (e.g., LIDAR sensor and camera) can process mesh data of different fidelities. For instance, based on the computational complexity of a sensor simulation model, mesh data of a certain fidelity level may be selected for processing by the respective sensor simulation model. In certain aspects, the LIDAR sensor simulation model 112 may generate a synthetic LIDAR point cloud from a mesh object, and the camera simulation model 114 may generate a synthetic image from a graphical representation of a synthetic driving scene.

In some aspects, a low-fidelity mesh objects 122 may be generated from a corresponding high-fidelity mesh object 124 based on a decimation process in which a number of vertices, edges, faces, and/or polygons may be reduced compared to the high-fidelity mesh object 124. In some examples, the AV compute process 142 may detect and identify an object in the synthetic driving scene using a synthetic LIDAR point cloud (generated by the LIDAR sensor simulation model 112) based on the low-fidelity mesh object 122. Accordingly, the low-fidelity mesh object 122 can be decimated (to provide a simpler 3D representation or geometry of the object) while still preserving the visual appearance of the object. In this way, the AV compute process 142 can still identify the object accurately. That is, if a low-fidelity mesh object 122 represents a human, the AV compute process 142 should identify a human from the synthetic LIDAR point cloud generated from the low-fidelity mesh object 122 and not a cat, for example. In general, not all detailed features (e.g., facial features, fine bone structures, etc.) may be needed for an object identification algorithm (of the AV compute process 142) to identify the human correctly. For instance, the object identification may identify an object correctly based on a profile, outline, or contour (e.g., a silhouette) of the object. In some examples, a low-fidelity mesh object 122 may include less than 30% of the number of vertices, edges, faces, and/or polygons compared to a corresponding high-fidelity mesh object 124. In certain examples, a low-fidelity mesh object 122 may include about 20% of the number of vertices, edges, faces, and/or polygons compared to a corresponding high-fidelity mesh object 124.

In some aspects, a low-fidelity mesh object 122 can be decimated from a corresponding high-fidelity mesh object 124 based on one or more configurable parameters. In some examples, the configuration parameters can include a target decimation rate, a target, upper bound, or lower bound for the number of vertices, edges, faces, and/or polygons for the generation of a low-fidelity mesh object. In some examples, the parameter may be set to a high fidelity and a low fidelity. In some examples, the parameter may be set to a high fidelity, a low fidelity, and a medium fidelity, where a low fidelity may remove a greater number of vertices, edges, faces, and/or polygons than the medium fidelity. In some examples, the parameter values can be set differently depending on the object type. For instance, one object type (e.g., a first object type) may need to preserve more detail features than another object type (e.g., a second object type) in order for an objection identification algorithm (of the AV compute process 142) to correctly identify the object. As such, a decimation rate for the first object type may be set to a lower value than a decimation rate for the second object type. In some examples, the configuration parameters may also be configured to provide more detailed features for a certain portion of an object in order for an object identification algorithm to correctly identify the object. That is, the decimation process can generate a low-fidelity mesh object 122 by removing less vertices, edges, faces, and/or polygons from one portion than another portion of a corresponding high-fidelity mesh object 124. In some aspects, the decimation can be performed using any suitable commercially available computer-aided design (CAD) software.

In general, an apparatus (e.g., the simulation platform 100 of FIG. 1, the simulation platform 656 of FIG. 6, and the system 700 of FIG. 7) may include a driving scenario simulator (e.g., the driving scenario simulator 130) to render a driving scene. As part of rendering the driving scene, the driving scenario simulation may place an object in the driving scene, where the object may be represented by high-fidelity mesh data. The apparatus may further include a sensor simulator (e.g., the sensor simulator 110) to generate LIDAR data based on low-fidelity mesh data representing the same object, where the low-fidelity mesh data may include a smaller number of vertices, edges, faces, and/or polygons than the high-fidelity mesh data. For instance, the high-fidelity mesh data and the low-fidelity mesh data may be obtained from a mesh object library similar to the multi-fidelity level mesh object library 120. The apparatus may further include a vehicle simulator (e.g., the vehicle simulator 140) to simulate at least one of an operation or a behavior of a vehicle (e.g., the AV 602) based on the driving scene and the LIDAR data. In some aspects, the sensor simulator may further generate the LIDAR data by applying a LIDAR sensor simulation model (e.g., the LIDAR sensor simulation model 112) to the low-fidelity mesh data and generate an image of the driving scene by applying a camera sensor simulation model to at least the high-fidelity mesh data. In some aspects, the vehicle simulator may simulate the at least one of the operation or the behavior of the vehicle by determining at least one of a perception, a prediction, a path, or a control decision based on the image and the LIDAR data.

In certain aspects, the generation of synthetic point clouds using the LIDAR sensor simulation model 112 may be executed using CPU(s) of the simulation platform 100 while the generation of images using the camera simulation model 114 may be executed using GPU(s) of the simulation platform 100.

FIGS. 2-4 are discussed in relation to FIG. 1 to illustrate generating sensor data of different sensing modalities from mesh data of different mesh fidelities. FIG. 2 illustrates an exemplary AV simulation scheme 200 using mesh objects of different fidelity levels, according to some embodiments of the present disclosure. The simulation scheme 200 may be implemented by the simulation platform 100 of FIG. 1, the simulation platform 656 of FIG. 6, and/or the system 700 of FIG. 7.

As shown in FIG. 2, the multi-fidelity level mesh object library 120 may include a high-fidelity mesh object library 202 and a low-fidelity mesh object library 204 (e.g., stored in a memory of the simulation platform 100). For instance, the high-fidelity mesh object library 202 may store the high-fidelity mesh objects 124 of FIG. 1, and the low-fidelity mesh object library 204 may store the low-fidelity mesh objects 122 of FIG. 1. Each high-fidelity mesh object 124 in the high-fidelity mesh object library 202 may have a corresponding low-fidelity mesh object 122 in the low-fidelity mesh object library 204, representing the same object. In general, the multi-fidelity level mesh object library 120 may arrange the storage of the low-fidelity mesh objects 122 and high-fidelity mesh objects 124 in any suitable way.

As further shown in FIG. 2, the driving scenario simulator 130 may receive high-fidelity mesh data 210 (e.g., a pedestrian) as input and may generate or render a synthetic driving scene 230 including the high-fidelity mesh data 210. For instance, as part of the generation or rendering, the driving scenario simulator 130 may place the high-fidelity mesh data 210 in the synthetic driving scene 230. On the other hand, the LIDAR sensor simulation model 112 may receive low-fidelity mesh data 220 modeling the same pedestrian but with a lower fidelity than the high-fidelity mesh data 210. In the illustrated example of FIG. 2, the high-fidelity mesh data 210 and the low-fidelity mesh data 220 are shown as meshes with wireframes, where the number of polygons in the low-fidelity mesh data 220 may be about half the number of polygons in the high-fidelity mesh data 210. In general, the low-fidelity mesh data 220 may have a smaller number of vertices, edges, faces, and/or polygons than the high-fidelity mesh data 210. The LIDAR sensor simulation model 112 may process the low-fidelity mesh data 220 to generate a LIDAR point cloud 240, for example, to reduce computational complexity. In a further aspect, the driving scenario simulator 130 may provide a graphical representation of the synthetic driving scene 230 to the camera simulation model 114 for synthetic image generation as discussed above. As will be discussed more fully below with reference to FIGS. 3-4, the LIDAR point cloud 240 generated from the low-fidelity mesh data 220 may have less data points than a LIDAR point cloud generated from the high-fidelity mesh data 210. The AV compute process 142 may generate at least one of a perception, a prediction, a path control, or a control based on the low-fidelity mesh data 220 and the synthetic driving scene 230.

In some aspects, the AV simulation scheme 200 may simulate a virtual driving scenario over a certain duration or time period. For instance, the virtual driving scenario may be provided as a streaming video. Accordingly, the driving scenario simulator 130 may be fed with a first frame of the virtual driving scenario at a first time instant and a second of the virtual driving scenario at a second time instant different from the first time instant. The first frame may include first high-fidelity mesh data representing the object at the first time instant. The second frame may include second high-fidelity mesh data representing the object at a second time instant. At the same time, the LIDAR sensor simulation model 112 may be fed with a first low-fidelity mesh data representing the object at the first time instant and second low-fidelity mesh data representing the object at the second time instant. In some aspects, the synthetic driving scene may include a first frame based on the first high-fidelity mesh data and a second frame based on the second high-fidelity mesh data. The synthetic sensor data may include first sensor data based on the first low-fidelity mesh data and second sensor data based on the second low-fidelity mesh data.

FIG. 3 illustrate an exemplary LIDAR point cloud 300 generated from a high-fidelity mesh object, according to some embodiments of the present disclosure. As shown in FIG. 3, the LIDAR sensor simulation model 112 may receive the high-fidelity mesh data 210 and may process the high-fidelity mesh data 210 to generate a LIDAR point cloud 300.

FIG. 4 illustrate an exemplary LIDAR point cloud 400 generated from a low-fidelity mesh object, according to some embodiments of the present disclosure. As shown in FIG. 4, the LIDAR sensor simulation model 112 may receive the low-fidelity mesh data 220 and may process the low-fidelity mesh data 220 to generate a LIDAR point cloud 400.

Comparing the LIDAR point cloud 400 of FIG. 4 to the LIDAR point cloud 300 of FIG. 3, the LIDAR point cloud 400 has a lower density (e.g., less data points) but the outline or contour of the LIDAR point cloud 400 is substantially the same as the LIDAR point cloud 300 (generated from the high-fidelity mesh data 210). While the LIDAR point cloud 400 has a lower density, the LIDAR point cloud 400 may provide sufficient features to allow an object identification algorithm (e.g., part of AV perception) to identify a human from the LIDAR point cloud 400.

Figure 5:
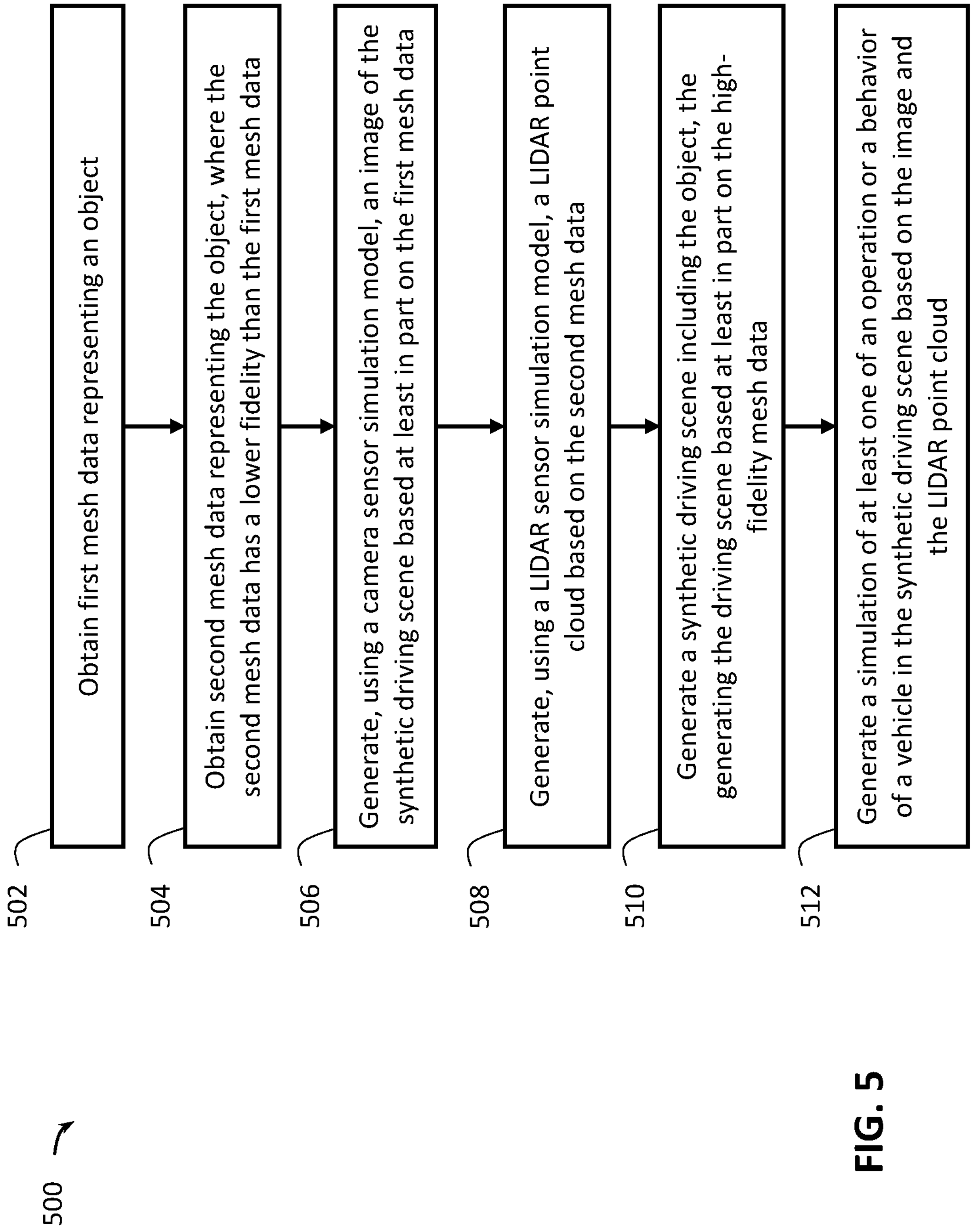
FIG. 5 is a flow diagram illustrating an exemplary AV simulation process, according to some embodiments of the present disclosure.

FIG. 5 is a flow diagram illustrating an exemplary AV simulation process 500, according to some embodiments of the present disclosure. The process 500 can be implemented by a computer-implemented system (e.g., the simulation platform 100 of FIG. 1, the simulation platform 656 of FIG. 6, and/or the system 700 of FIG. 7). In general, the process 500 may be performed using any suitable hardware components and/or software components. The process 500 may utilize similar mechanisms discussed above with reference to FIGS. 1-4. Operations are illustrated once each and in a particular order in FIG. 5, but the operations may be performed in parallel, reordered, and/or repeated as desired.

At 502, the computer-implemented system may obtain first mesh data representing an object in a synthetic driving scene. For instance, the object may be a pedestrian, a cyclist, a vehicle, a building, a tree, or any object that may be present in a real-world driving environment.

At 504, the computer-implemented system may obtain second mesh data representing the object, where the second mesh data may have a lower fidelity in representing the object than the first mesh data. That is, the second mesh data may include a smaller number of vertices, edges, faces, and/or polygons than the first mesh data. In some instances, the first mesh data may correspond to a high-fidelity mesh object 124 and the second mesh data may correspond to a low-fidelity mesh object 122 as discussed above with reference to FIG. 1. In some instances, the first mesh data may correspond to a high-fidelity mesh object 210 and the second mesh data may correspond to a low-fidelity mesh object 220 as discussed above with reference to FIG. 2. In some aspects, as part of obtaining the second mesh data, the computer-implemented system may generate the second mesh data by removing one or more vertices, edges, faces, and/or polygons from the first mesh data based on a parameter (e.g., a target, an upper bound, or a lower bound related to a number of vertices, edges, faces, and/or polygons in the second mesh data).

At 506, the computer-implemented system may generate, using a camera sensor simulation model, an image of the synthetic driving scene based at least in part on the first mesh data. In some instances, the camera sensor simulation model may correspond to the camera simulation model 114.

At 508, the computer-implemented system may generate, using a LIDAR sensor simulation model, a LIDAR point cloud based on the second mesh data. In some instances, the LIDAR sensor simulation model may correspond to the LIDAR sensor simulation model 112 and the LIDAR point cloud may correspond to the LIDAR point cloud 240.

At 510, the computer-implemented system may generate a simulation of at least one of an operation or a behavior of a vehicle (e.g., the AV 602 of FIG. 6) in the synthetic driving scene based on the image and the LIDAR point cloud. In some aspects, as part of generating the simulation of the at least one of the operation or the behavior of the vehicle, the computer-implemented system may perform at least one of perception, prediction, path planning, or control based on the image and the LIDAR point cloud.

Figure 6:
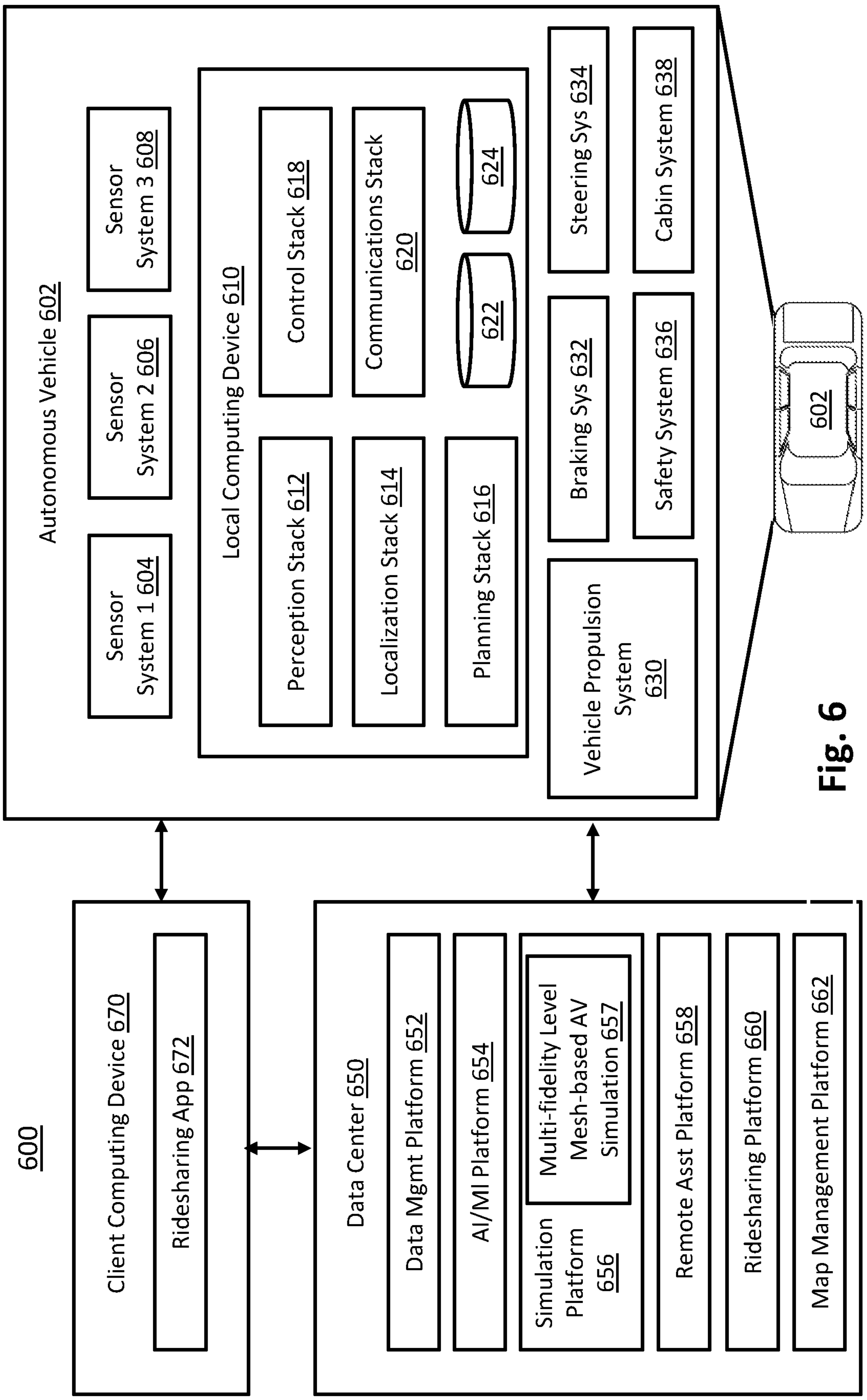
FIG. 6 illustrates an example system environment that may be used to facilitate AV dispatch and operations, according to some aspects of the disclosed technology.

Turning now to FIG. 6, this figure illustrates an example of an AV management system 600. One of ordinary skill in the art will understand that, for the AV management system 600 and any system discussed in the present disclosure, there may be additional or fewer components in similar or alternative configurations. The illustrations and examples provided in the present disclosure are for conciseness and clarity. Other embodiments may include different numbers and/or types of elements, but one of ordinary skill the art will appreciate that such variations do not depart from the scope of the present disclosure.

In this example, the AV management system 600 includes an AV 602, a data center 650, and a client computing device 670. The AV 602, the data center 650, and the client computing device 670 may communicate with one another over one or more networks (not shown), such as a public network (e.g., the Internet, an Infrastructure as a Service (IaaS) network, a Platform as a Service (PaaS) network, a Software as a Service (SaaS) network, another Cloud Service Provider (CSP) network, etc.), a private network (e.g., a Local Area Network (LAN), a private cloud, a Virtual Private Network (VPN), etc.), and/or a hybrid network (e.g., a multi-cloud or hybrid cloud network, etc.).

AV 602 may navigate about roadways without a human driver based on sensor signals generated by multiple sensor systems 604, 606, and 608. The sensor systems 604-608 may include different types of sensors and may be arranged about the AV 602. For instance, the sensor systems 604-608 may comprise IMUs, cameras (e.g., still image cameras, video cameras, etc.), light sensors (e.g., LIDAR systems, ambient light sensors, infrared sensors, etc.), RADAR systems, a Global Navigation Satellite System (GNSS) receiver, (e.g., Global Positioning System (GPS) receivers), audio sensors (e.g., microphones, Sound Navigation and Ranging (SONAR) systems, ultrasonic sensors, etc.), engine sensors, speedometers, tachometers, odometers, altimeters, tilt sensors, impact sensors, airbag sensors, seat occupancy sensors, open/closed door sensors, tire pressure sensors, rain sensors, and so forth. For example, the sensor system 604 may be a camera system, the sensor system 606 may be a LIDAR system, and the sensor system 608 may be a RADAR system. Other embodiments may include any other number and type of sensors.

AV 602 may also include several mechanical systems that may be used to maneuver or operate AV 602. For instance, the mechanical systems may include vehicle propulsion system 630, braking system 632, steering system 634, safety system 636, and cabin system 638, among other systems. Vehicle propulsion system 630 may include an electric motor, an internal combustion engine, or both. The braking system 632 may include an engine brake, a wheel braking system (e.g., a disc braking system that utilizes brake pads), hydraulics, actuators, and/or any other suitable componentry configured to assist in decelerating AV 602. The steering system 634 may include suitable componentry configured to control the direction of movement of the AV 602 during navigation. Safety system 636 may include lights and signal indicators, a parking brake, airbags, and so forth. The cabin system 638 may include cabin temperature control systems, in-cabin entertainment systems, and so forth. In some embodiments, the AV 602 may not include human driver actuators (e.g., steering wheel, handbrake, foot brake pedal, foot accelerator pedal, turn signal lever, window wipers, etc.) for controlling the AV 602. Instead, the cabin system 638 may include one or more client interfaces (e.g., Graphical User Interfaces (GUIs), Voice User Interfaces (VUIs), etc.) for controlling certain aspects of the mechanical systems 630-638.

AV 602 may additionally include a local computing device 610 that is in communication with the sensor systems 604-608, the mechanical systems 630-638, the data center 650, and the client computing device 670, among other systems. The local computing device 610 may include one or more processors and memory, including instructions that may be executed by the one or more processors. The instructions may make up one or more software stacks or components responsible for controlling the AV 602; communicating with the data center 650, the client computing device 670, and other systems; receiving inputs from riders, passengers, and other entities within the AV's environment; logging metrics collected by the sensor systems 604-608; and so forth. In this example, the local computing device 610 includes a perception stack 612, a mapping and localization stack 614, a planning stack 616, a control stack 618, a communications stack 620, a High Definition (HD) geospatial database 622, and an AV operational database 624, among other stacks and systems.

Perception stack 612 may enable the AV 602 to "see" (e.g., via cameras, LIDAR sensors, infrared sensors, etc.), "hear" (e.g., via microphones, ultrasonic sensors, RADAR, etc.), and "feel" (e.g., pressure sensors, force sensors, impact sensors, etc.) its environment using information from the sensor systems 604-608, the mapping and localization stack 614, the HD geospatial database 622, other components of the AV, and other data sources (e.g., the data center 650, the client computing device 670, third-party data sources, etc.). The perception stack 612 may detect and classify objects and determine their current and predicted locations, speeds, directions, and the like. In addition, the perception stack 612 may determine the free space around the AV 602 (e.g., to maintain a safe distance from other objects, change lanes, park the AV, etc.). The perception stack 612 may also identify environmental uncertainties, such as where to look for moving objects, flag areas that may be obscured or blocked from view, and so forth.

Mapping and localization stack 614 may determine the AV's position and orientation (pose) using different methods from multiple systems (e.g., GPS, IMUs, cameras, LIDAR, RADAR, ultrasonic sensors, the HD geospatial database 622, etc.). For example, in some embodiments, the AV 602 may compare sensor data captured in real-time by the sensor systems 604-608 to data in the HD geospatial database 622 to determine its precise (e.g., accurate to the order of a few centimeters or less) position and orientation. The AV 602 may focus its search based on sensor data from one or more first sensor systems (e.g., GPS) by matching sensor data from one or more second sensor systems (e.g., LIDAR). If the mapping and localization information from one system is unavailable, the AV 602 may use mapping and localization information from a redundant system and/or from remote data sources.

The planning stack 616 may determine how to maneuver or operate the AV 602 safely and efficiently in its environment. For example, the planning stack 616 may receive the location, speed, and direction of the AV 602, geospatial data, data regarding objects sharing the road with the AV 602 (e.g., pedestrians, bicycles, vehicles, ambulances, buses, cable cars, trains, traffic lights, lanes, road markings, etc.) or certain events occurring during a trip (e.g., an Emergency Vehicle (EMV) blaring a siren, intersections, occluded areas, street closures for construction or street repairs, Double-Parked Vehicles (DPVs), etc.), traffic rules and other safety standards or practices for the road, user input, and other relevant data for directing the AV 602 from one point to another. The planning stack 616 may determine multiple sets of one or more mechanical operations that the AV 602 may perform (e.g., go straight at a specified speed or rate of acceleration, including maintaining the same speed or decelerating; turn on the left blinker, decelerate if the AV is above a threshold range for turning, and turn left; turn on the right blinker, accelerate if the AV is stopped or below the threshold range for turning, and turn right; decelerate until completely stopped and reverse; etc.), and select the best one to meet changing road conditions and events. If something unexpected happens, the planning stack 616 may select from multiple backup plans to carry out. For example, while preparing to change lanes to turn right at an intersection, another vehicle may aggressively cut into the destination lane, making the lane change unsafe. The planning stack 616 could have already determined an alternative plan for such an event, and upon its occurrence, help to direct the AV 602 to go around the block instead of blocking a current lane while waiting for an opening to change lanes.

The control stack 618 may manage the operation of the vehicle propulsion system 630, the braking system 632, the steering system 634, the safety system 636, and the cabin system 638. The control stack 618 may receive sensor signals from the sensor systems 604-608 as well as communicate with other stacks or components of the local computing device 610 or a remote system (e.g., the data center 650) to effectuate operation of the AV 602. For example, the control stack 618 may implement the final path or actions from the multiple paths or actions provided by the planning stack 616. Implementation may involve turning the routes and decisions from the planning stack 616 into commands for the actuators that control the AV's steering, throttle, brake, and drive unit.

In some aspects, the perception stack 612, the localization stack 614, the planning stack 616, and the control stack 618 may be part of an AV compute software similar to the AV compute process 142 of FIG. 1, where the AV compute software may be trained, tested, and validated in a simulation environment using mesh data with different fidelities to generate sensor data of different sensing modalities as discussed herein.

The communication stack 620 may transmit and receive signals between the various stacks and other components of the AV 602 and between the AV 602, the data center 650, the client computing device 670, and other remote systems. The communication stack 620 may enable the local computing device 610 to exchange information remotely over a network, such as through an antenna array or interface that may provide a metropolitan WIFI® network connection, a mobile or cellular network connection (e.g., Third Generation (3G), Fourth Generation (4G), Long-Term Evolution (LTE), 5th Generation (5G), etc.), and/or other wireless network connection (e.g., License Assisted Access (LAA), Citizens Broadband Radio Service (CBRS), MULTEFIRE, etc.). The communication stack 620 may also facilitate local exchange of information, such as through a wired connection (e.g., a user's mobile computing device docked in an in-car docking station or connected via Universal Serial Bus (USB), etc.) or a local wireless connection (e.g., Wireless Local Area Network (WLAN), Bluetooth®, infrared, etc.).

The HD geospatial database 622 may store HD maps and related data of the streets upon which the AV 602 travels. In some embodiments, the HD maps and related data may comprise multiple layers, such as an areas layer, a lanes and boundaries layer, an intersections layer, a traffic controls layer, and so forth. The areas layer may include geospatial information indicating geographic areas that are drivable (e.g., roads, parking areas, shoulders, etc.) or not drivable (e.g., medians, sidewalks, buildings, etc.), drivable areas that constitute links or connections (e.g., drivable areas that form the same road) versus intersections (e.g., drivable areas where two or more roads intersect), and so on. The lanes and boundaries layer may include geospatial information of road lanes (e.g., lane or road centerline, lane boundaries, type of lane boundaries, etc.) and related attributes (e.g., direction of travel, speed limit, lane type, etc.). The lanes and boundaries layer may also include 3D attributes related to lanes (e.g., slope, elevation, curvature, etc.). The intersections layer may include geospatial information of intersections (e.g., crosswalks, stop lines, turning lane centerlines, and/or boundaries, etc.) and related attributes (e.g., permissive, protected/permissive, or protected only left turn lanes; permissive, protected/permissive, or protected only U-turn lanes; permissive or protected only right turn lanes; etc.). The traffic controls layer may include geospatial information of traffic signal lights, traffic signs, and other road objects and related attributes.

The AV operational database 624 may store raw AV data generated by the sensor systems 604-608 and other components of the AV 602 and/or data received by the AV 602 from remote systems (e.g., the data center 650, the client computing device 670, etc.). In some embodiments, the raw AV data may include HD LIDAR point cloud data, image or video data, RADAR data, GPS data, and other sensor data that the data center 650 may use for creating or updating AV geospatial data.

The data center 650 may be a private cloud (e.g., an enterprise network, a co-location provider network, etc.), a public cloud (e.g., an Infrastructure as a Service (IaaS) network, a Platform as a Service (PaaS) network, a Software as a Service (SaaS) network, or other Cloud Service Provider (CSP) network), a hybrid cloud, a multi-cloud, and so forth. The data center 650 may include one or more computing devices remote to the local computing device 610 for managing a fleet of AVs and AV-related services. For example, in addition to managing the AV 602, the data center 650 may also support a ridesharing service, a delivery service, a remote/roadside assistance service, street services (e.g., street mapping, street patrol, street cleaning, street metering, parking reservation, etc.), and the like.

The data center 650 may send and receive various signals to and from the AV 602 and the client computing device 670. These signals may include sensor data captured by the sensor systems 604-608, roadside assistance requests, software updates, ridesharing pick-up and drop-off instructions, and so forth. In this example, the data center 650 includes one or more of a data management platform 652, an Artificial Intelligence/Machine Learning (AI/ML) platform 654, a simulation platform 656, a remote assistance platform 658, a ridesharing platform 660, and a map management platform 662, among other systems.

Data management platform 652 may be a "big data" system capable of receiving and transmitting data at high speeds (e.g., near real-time or real-time), processing a large variety of data, and storing large volumes of data (e.g., terabytes, petabytes, or more of data). The varieties of data may include data having different structures (e.g., structured, semi-structured, unstructured, etc.), data of different types (e.g., sensor data, mechanical system data, ridesharing service data, map data, audio data, video data, etc.), data associated with different types of data stores (e.g., relational databases, key-value stores, document databases, graph databases, column-family databases, data analytic stores, search engine databases, time series databases, object stores, file systems, etc.), data originating from different sources (e.g., AVs, enterprise systems, social networks, etc.), data having different rates of change (e.g., batch, streaming, etc.), or data having other heterogeneous characteristics. The various platforms and systems of the data center 650 may access data stored by the data management platform 652 to provide their respective services.

The AI/ML platform 654 may provide the infrastructure for training and evaluating machine learning algorithms for operating the AV 602, the simulation platform 656, the remote assistance platform 658, the ridesharing platform 660, the map management platform 662, and other platforms and systems. Using the AI/ML platform 654, data scientists may prepare data sets from the data management platform 652; select, design, and train machine learning models; evaluate, refine, and deploy the models; maintain, monitor, and retrain the models; and so on.

The simulation platform 656 may enable testing and validation of the algorithms, machine learning models, neural networks, and other development efforts for the AV 602, the remote assistance platform 658, the ridesharing platform 660, the map management platform 662, and other platforms and systems. The simulation platform 656 may replicate a variety of driving environments and/or reproduce real-world scenarios from data captured by the AV 602, including rendering geospatial information and road infrastructure (e.g., streets, lanes, crosswalks, traffic lights, stop signs, etc.) obtained from the map management platform 662; modeling the behavior of other vehicles, bicycles, pedestrians, and other dynamic elements; simulating inclement weather conditions, different traffic scenarios; and so on. In some embodiments, the simulation platform 656 may include a multi-fidelity level mesh-based AV simulation block 657 that utilizes mesh data with different fidelities (e.g., the high-fidelity mesh objects 124 and the low-fidelity mesh objects 122) to generate synthetic sensor data of different sensing modalities as discussed herein.

The remote assistance platform 658 may generate and transmit instructions regarding the operation of the AV 602. For example, in response to an output of the AI/ML platform 654 or other system of the data center 650, the remote assistance platform 658 may prepare instructions for one or more stacks or other components of the AV 602.

The ridesharing platform 660 may interact with a customer of a ridesharing service via a ridesharing application 672 executing on the client computing device 670. The client computing device 670 may be any type of computing system, including a server, desktop computer, laptop, tablet, smartphone, smart wearable device (e.g., smart watch; smart eyeglasses or other Head-Mounted Display (HMD); smart ear pods or other smart in-car, on-car, or over-ear device; etc.), gaming system, or other general purpose computing device for accessing the ridesharing application 672. The client computing device 670 may be a customer's mobile computing device or a computing device integrated with the AV 602 (e.g., the local computing device 610). The ridesharing platform 660 may receive requests to be picked up or dropped off from the ridesharing application 672 and dispatch the AV 602 for the trip.

Map management platform 662 may provide a set of tools for the manipulation and management of geographic and spatial (geospatial) and related attribute data. The data management platform 652 may receive LIDAR point cloud data, image data (e.g., still image, video, etc.), RADAR data, GPS data, and other sensor data (e.g., raw data) from one or more AVs 602, Unmanned Aerial Vehicles (UAVs), satellites, third-party mapping services, and other sources of geospatially referenced data. The raw data may be processed, and map management platform 662 may render base representations (e.g., tiles (2D), bounding volumes (3D), etc.) of the AV geospatial data to enable users to view, query, label, edit, and otherwise interact with the data. Map management platform 662 may manage workflows and tasks for operating on the AV geospatial data. Map management platform 662 may control access to the AV geospatial data, including granting or limiting access to the AV geospatial data based on user-based, role-based, group-based, task-based, and other attribute-based access control mechanisms. Map management platform 662 may provide version control for the AV geospatial data, such as to track specific changes that (human or machine) map editors have made to the data and to revert changes when necessary. Map management platform 662 may administer release management of the AV geospatial data, including distributing suitable iterations of the data to different users, computing devices, AVs, and other consumers of HD maps. Map management platform 662 may provide analytics regarding the AV geospatial data and related data, such as to generate insights relating to the throughput and quality of mapping tasks.

In some embodiments, the map viewing services of map management platform 662 may be modularized and deployed as part of one or more of the platforms and systems of the data center 650. For example, the AI/ML platform 654 may incorporate the map viewing services for visualizing the effectiveness of various object detection or object classification models, the simulation platform 656 may incorporate the map viewing services for recreating and visualizing certain driving scenarios, the remote assistance platform 658 may incorporate the map viewing services for replaying traffic incidents to facilitate and coordinate aid, the ridesharing platform 660 may incorporate the map viewing services into the client application 672 to enable passengers to view the AV 602 in transit en route to a pick-up or drop-off location, and so on.

Figure 7:
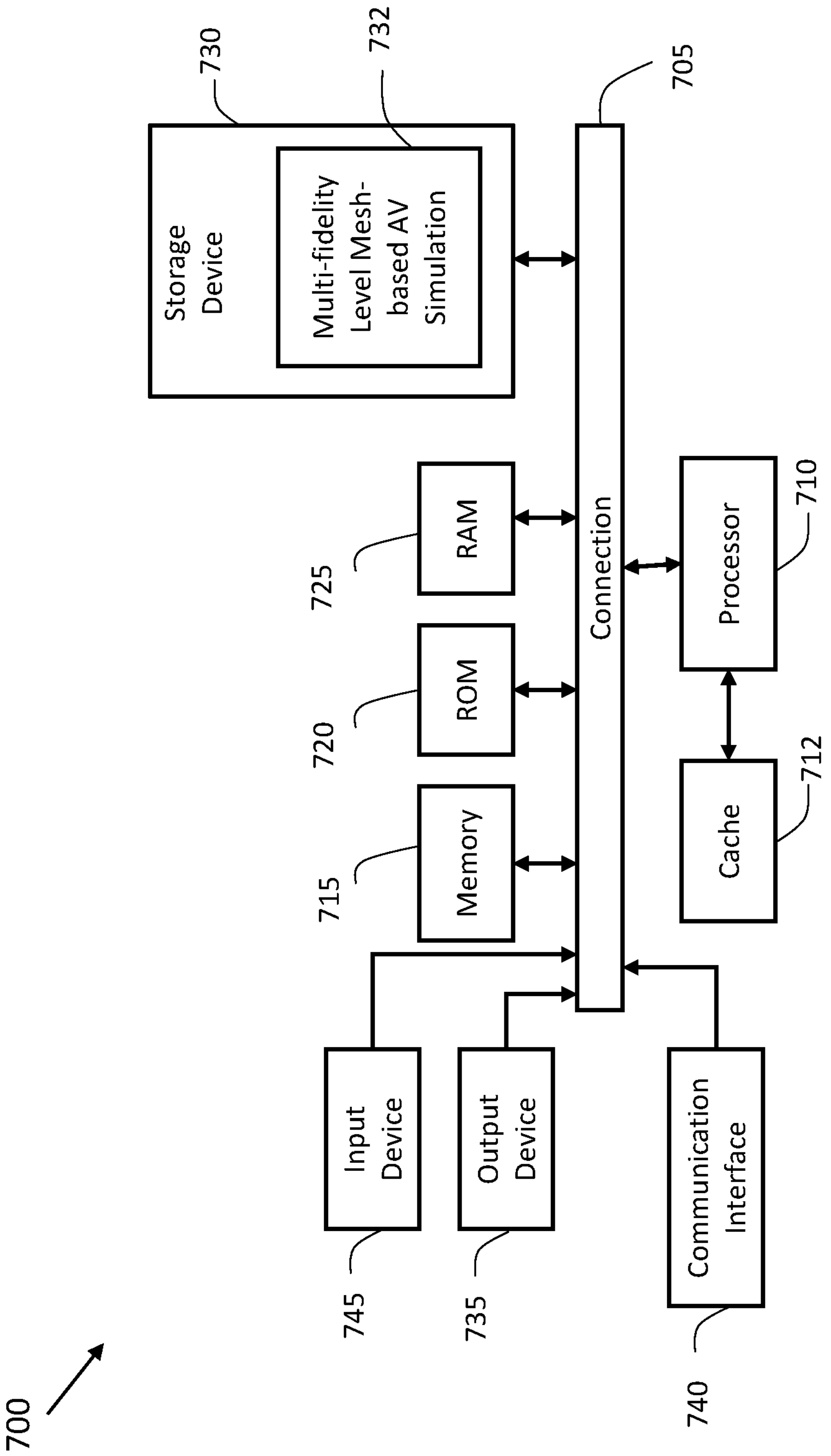
FIG. 7 illustrates an example processor-based system with which some aspects of the subject technology may be implemented.

FIG. 7 illustrates an example processor-based system with which some aspects of the subject technology may be implemented. For example, processor-based system 700 may be any computing device making up, or any component thereof in which the components of the system are in communication with each other using connection 705. Connection 705 may be a physical connection via a bus, or a direct connection into processor 710, such as in a chipset architecture. Connection 705 may also be a virtual connection, networked connection, or logical connection.

In some embodiments, computing system 700 is a distributed system in which the functions described in this disclosure may be distributed within a datacenter, multiple data centers, a peer network, etc. In some embodiments, one or more of the described system components represents many such components each performing some or all of the function for which the component is described. In some embodiments, the components may be physical or virtual devices.

Example system 700 includes at least one processing unit (CPU or processor) 710 and connection 705 that couples various system components including system memory 715, such as Read-Only Memory (ROM) 720 and Random-Access Memory (RAM) 725 to processor 710. Computing system 700 may include a cache of high-speed memory 712 connected directly with, in close proximity to, or integrated as part of processor 710.

Processor 710 may include any general-purpose processor and a hardware service or software service, such as a multi-fidelity level mesh-based AV simulation software 732 (e.g., including a sensor simulator 110, a driving scenario simulator 130, and a vehicle simulator 140 of FIG. 1) stored in storage device 730, configured to control processor 710 as well as a special-purpose processor where software instructions are incorporated into the actual processor design. The multi-fidelity level mesh-based AV simulation software 732 may generate synthetic sensor data based low-fidelity mesh data representing an object, generate a synthetic driving scene including the object based on high-fidelity mesh data representing the object, and execute a vehicle compute process based on the synthetic driving scene and the synthetic sensor data as discussed herein. Processor 710 may essentially be a completely self-contained computing system, containing multiple cores or processors, a bus, memory controller, cache, etc. A multi-core processor may be symmetric or asymmetric.

To enable user interaction, computing system 700 includes an input device 745, which may represent any number of input mechanisms, such as a microphone for speech, a touch-sensitive screen for gesture or graphical input, keyboard, mouse, motion input, speech, etc. Computing system 700 may also include output device 735, which may be one or more of a number of output mechanisms known to those of skill in the art. In some instances, multimodal systems may enable a user to provide multiple types of input/output to communicate with computing system 700. Computing system 700 may include communications interface 740, which may generally govern and manage the user input and system output. The communication interface may perform or facilitate receipt and/or transmission wired or wireless communications via wired and/or wireless transceivers, including those making use of an audio jack/plug, a microphone jack/plug, a Universal Serial Bus (USB) port/plug, an Apple® Lightning® port/plug, an Ethernet port/plug, a fiber optic port/plug, a proprietary wired port/plug, a BLUETOOTH® wireless signal transfer, a BLUETOOTH® low energy (BLE) wireless signal transfer, an IBEACON® wireless signal transfer, a Radio-Frequency Identification (RFID) wireless signal transfer, Near-Field Communications (NFC) wireless signal transfer, Dedicated Short Range Communication (DSRC) wireless signal transfer, 802.11 Wi-Fi® wireless signal transfer, Wireless Local Area Network (WLAN) signal transfer, Visible Light Communication (VLC) signal transfer, Worldwide Interoperability for Microwave Access (WiMAX), Infrared (IR) communication wireless signal transfer, Public Switched Telephone Network (PSTN) signal transfer, Integrated Services Digital Network (ISDN) signal transfer, 3G/4G/5G/LTE cellular data network wireless signal transfer, ad-hoc network signal transfer, radio wave signal transfer, microwave signal transfer, infrared signal transfer, visible light signal transfer signal transfer, ultraviolet light signal transfer, wireless signal transfer along the electromagnetic spectrum, or some combination thereof.

Communication interface 740 may also include one or more Global Navigation Satellite System (GNSS) receivers or transceivers that are used to determine a location of the computing system 700 based on receipt of one or more signals from one or more satellites associated with one or more GNSS systems. GNSS systems include, but are not limited to, the US-based Global Positioning System (GPS), the Russia-based Global Navigation Satellite System (GLONASS), the China-based BeiDou Navigation Satellite System (BDS), and the Europe-based Galileo GNSS. There is no restriction on operating on any particular hardware arrangement, and therefore the basic features here may easily be substituted for improved hardware or firmware arrangements as they are developed.

Storage device 730 may be a non-volatile and/or non-transitory and/or computer-readable memory device and may be a hard disk or other types of computer-readable media which may store data that are accessible by a computer, such as magnetic cassettes, flash memory cards, solid state memory devices, digital versatile disks, cartridges, a floppy disk, a flexible disk, a hard disk, magnetic tape, a magnetic strip/stripe, any other magnetic storage medium, flash memory, memristor memory, any other solid-state memory, a Compact Disc (CD) Read Only Memory (CD-ROM) optical disc, a rewritable CD optical disc, a Digital Video Disk (DVD) optical disc, a Blu-ray Disc (BD) optical disc, a holographic optical disk, another optical medium, a Secure Digital (SD) card, a micro SD (microSD) card, a Memory Stick® card, a smartcard chip, a EMV chip, a Subscriber Identity Module (SIM) card, a mini/micro/nano/pico SIM card, another Integrated Circuit (IC) chip/card, Random-Access Memory (RAM), Atatic RAM (SRAM), Dynamic RAM (DRAM), Read-Only Memory (ROM), Programmable ROM (PROM), Erasable PROM (EPROM), Electrically Erasable PROM (EEPROM), flash EPROM (FLASHEPROM), cache memory (L1/L2/L3/L4/L5/L #), Resistive RAM (RRAM/ReRAM), Phase Change Memory (PCM), Spin Transfer Torque RAM (STT-RAM), another memory chip or cartridge, and/or a combination thereof.

Storage device 730 may include software services, servers, services, etc., that when the code that defines such software is executed by the processor 710, it causes the system 700 to perform a function. In some embodiments, a hardware service that performs a particular function may include the software component stored in a computer-readable medium in connection with the necessary hardware components, such as processor 710, connection 705, output device 735, etc., to carry out the function.

Embodiments within the scope of the present disclosure may also include tangible and/or non-transitory computer-readable storage media or devices for carrying or having computer-executable instructions or data structures stored thereon. Such tangible computer-readable storage devices may be any available device that may be accessed by a general-purpose or special purpose computer, including the functional design of any special purpose processor as described above. By way of example, and not limitation, such tangible computer-readable devices may include RAM, ROM, EEPROM, CD-ROM or other optical disk storage, magnetic disk storage or other magnetic storage devices, or any other device which may be used to carry or store desired program code in the form of computer-executable instructions, data structures, or processor chip design. When information or instructions are provided via a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable storage devices.

Computer-executable instructions include, for example, instructions and data which cause a general-purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform tasks or implement abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network Personal Computers (PCs), minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

SELECTED EXAMPLES

Example 1 includes a computer-implemented system, including one or more processing units; and one or more non-transitory computer-readable media storing instructions, when executed by the one or more processing units, cause the one or more processing units to perform operations including generating synthetic sensor data based on low-fidelity mesh data representing an object; generating a synthetic driving scene including the object, the generating the synthetic driving scene is based at least in part on high-fidelity mesh data representing the object; and executing a vehicle compute process based on the synthetic driving scene and the synthetic sensor data.

In example 2, the computer-implemented system of example 1 can optionally include where the low-fidelity mesh data includes a smaller number of at least one of vertices, faces, bones, or polygons than the high-fidelity mesh data.

In example 3, the computer-implemented system of any of examples 1-2 can optionally include where the smaller number of the at least one of vertices, faces, bones, or polygons of the low-fidelity mesh data is based on a characteristic of the object.

In example 4, the computer-implemented system of any of examples 1-3 can optionally include where the object represented by the high-fidelity mesh data and the low-fidelity mesh data includes a human.

In example 5, the computer-implemented system of any of examples 1-4 can optionally include where the generating the synthetic sensor data includes generating light detection and ranging (LIDAR) return signals based on the low-fidelity mesh data representing the object.

In example 6, the computer-implemented system of any of examples 1-5 can optionally include where the operations further include generating a synthetic image of the synthetic driving scene based at least in part on the high-fidelity mesh data representing the object.

In example 7, the computer-implemented system of any of examples 1-6 can optionally include where the executing the vehicle compute process includes determining a perception of the object based on the synthetic sensor data generated based on the low-fidelity mesh data; and determining at least one of a prediction, a path, or a vehicle control based on the perception and the synthetic driving scene.

In example 8, the computer-implemented system of any of examples 1-7 can optionally include where the high-fidelity mesh data includes first high-fidelity mesh data representing the object at a first time instant; and second high-fidelity mesh data representing the object at a second time instant different from the first time instant; and the low-fidelity mesh data includes first low-fidelity mesh data representing the object at the first time instant; and second low-fidelity mesh data representing the object at the second time instant.

In example 9, the computer-implemented system of any of examples 1-8 can optionally include where the synthetic driving scene includes a first frame based on the first high-fidelity mesh data; and a second frame based on the second high-fidelity mesh data; the synthetic sensor data includes first sensor data based on the first low-fidelity mesh data; and second sensor data based on the second low-fidelity mesh data.

In example 10, the computer-implemented system of any of examples 1-9 can optionally include where the operations further include reading, from a mesh object library, the high-fidelity mesh data and the low-fidelity mesh data.

In example 11, the computer-implemented system of any of examples 1-10 can optionally include further including a memory to store the mesh object library, the mesh object library including a high-fidelity mesh object library including the high-fidelity mesh data; and a low-fidelity mesh object library including the low-fidelity mesh data.

In example 12, the computer-implemented system of any of examples 1-11 can optionally include where the one or more processing units includes at least one central processing unit (CPU), where the generating the synthetic sensor data is performed by the CPU, at least one graphical processing unit (GPU), where the generating the synthetic driving scene is performed by the GPU.

In example 13, the computer-implemented system of any of examples 1-12 can optionally include where the generating the synthetic driving scene is based on data captured from a real-world driving environment.

Example 14 include an apparatus including a driving scenario simulator to render a driving scene, where the rendering includes placing an object in the driving scene, the object being based on high-fidelity mesh data; a sensor simulator to generate synthetic light detection and ranging (LIDAR) data based on low-fidelity mesh data representing the object; and a vehicle simulator to simulate at least one of an operation or a behavior of a vehicle based on the driving scene and the LIDAR data.

In example 15, the apparatus of example 14 can optionally include where the low-fidelity mesh data includes a smaller number of at least one of vertices, edges, faces, or polygons than the high-fidelity mesh data.

In example 16, the apparatus of any of examples 14-15 can optionally include where the smaller number of the at least one vertices, edges, faces, or polygons is based on a configuration parameter.

In example 17, the apparatus of any of examples 14-16 can optionally include where a number of vertices in the low-fidelity mesh data is less than 30% of a number of vertices in the high-fidelity mesh data.

In example 18, the apparatus of any of examples 14-17 can optionally include where the sensor simulator further generates the LIDAR data by applying a LIDAR sensor simulation model to the low-fidelity mesh data; and generates an image of the driving scene by applying a camera sensor simulation model to at least the high-fidelity mesh data.

In example 19, the apparatus of any of examples 14-18 can optionally include where the vehicle simulator simulates the at least one of the operation or the behavior of the vehicle by determining at least one of a perception, a prediction, a path, or a control decision based on the image and the LIDAR data.

Example 20 includes a method including obtaining, by a computer-implemented system, first mesh data representing an object in a synthetic driving scene; obtaining, by the computer-implemented system, second mesh data representing the object, where the second mesh data has a lower fidelity in representing the object than the first mesh data; generating, by the computer-implemented system, using a camera sensor simulation model, an image of the synthetic driving scene based at least in part on the first mesh data; and generating, by the computer-implemented system, using a light detection and ranging (LIDAR) sensor simulation model, a LIDAR point cloud based on the second mesh data; and generating, by the computer-implemented system, a simulation of at least one of an operation or a behavior of a vehicle in the synthetic driving scene based on the image and the LIDAR point cloud.

In example 21, the method of example 20, where the second mesh data includes a smaller number of vertices than the first mesh data.

In example 22, the method of any of examples 20-21 can optionally include where the obtaining the second mesh data includes generating the second mesh data by removing one or more vertices from the first mesh data, the removing based on a parameter.

In example 23, the method of any of examples 20-22 can optionally include where the generating the simulation of the at least one of the operation or the behavior of the vehicle includes performing at least one of perception, prediction, path planning, or control based on the image and the LIDAR point cloud The various embodiments described above are provided by way of illustration only and should not be construed to limit the scope of the disclosure. For example, the principles herein apply equally to optimization as well as general improvements. Various modifications and changes may be made to the principles described herein without following the example embodiments and applications illustrated and described herein, and without departing from the spirit and scope of the disclosure. Claim language reciting "at least one of" a set indicates that one member of the set or multiple members of the set satisfy the claim.

The invention claimed is:

1. A computer-implemented system, comprising:

one or more processing units; and one or more non-transitory computer-readable media storing instructions, the instructions defining a simulation platform comprising a driving scenario model representative of a real-world driving environment, the driving scenario model including a mesh library having 3D meshes representative of real-world objects, the 3D meshes including a set of high-fidelity mesh data and a set of low-fidelity mesh data representing the same 3D objects, and a vehicle model representative of a real-world vehicle, the vehicle model comprising a set of physics-based sensor models configured to simulate the real-world operation of at least two different real-world sensors having different real-time simulation processing requirements, wherein the instructions, when executed by the one or more processing units, cause the one or more processing units to perform operations comprising:

generating, via the driving scenario model of the simulation platform, a synthetic driving scene including synthetic 3D objects, the synthetic 3D objects being based at least in part on high-fidelity mesh data representing the 3D objects;

generating, via the first sensor model of the simulation platform, a first synthetic representation of the synthetic driving scene, wherein the first synthetic representation includes a first set of synthetic 3D objects that correspond to the synthetic 3D objects of the synthetic driving scene, the first set of synthetic 3D objects being based at least in part on the high-fidelity mesh data;

selecting, from the set of low-fidelity mesh data, one or more low-fidelity 3D meshes representing the first set of synthetic 3D objects, wherein the low-fidelity 3D meshes are selected based on a processing requirement of the second sensor model compared to a processing requirement of the first sensor model;

generating, via the second sensor model of the simulation platform, the second synthetic representation of the synthetic driving scene in real-time with the first synthetic representation, wherein the second synthetic representation includes a second set of synthetic 3D objects that correspond to the synthetic 3D objects of the synthetic driving scene and the first set of 3D objects of the first synthetic representation, the second set of synthetic 3D objects being based at least in part on the selected low-fidelity 3D meshes;

providing the high-fidelity synthetic driving scene, the first synthetic representation, and the second synthetic representation as inputs to a vehicle compute process of the vehicle model; and executing, via the vehicle compute process, operation of the vehicle model of the simulation platform based on the high-fidelity synthetic driving scene, the first synthetic representation, and the second synthetic representation.

2. The computer-implemented system of claim 1, wherein the low-fidelity mesh data includes a smaller number of at least one of vertices, faces, bones, or polygons than the high-fidelity mesh data.

3. The computer-implemented system of claim 2, wherein the smaller number of the at least one of vertices, faces, bones, or polygons of the low-fidelity mesh data is based on a characteristic of the object.

4. The computer-implemented system of claim 1, wherein the object represented by the high-fidelity mesh data and the low-fidelity mesh data includes a human.

5. The computer-implemented system of claim 1, wherein the high-fidelity synthetic driving scene is updated based on the operation of the vehicle model.

6. The computer-implemented system of claim 1, wherein the set of physics-based sensor models further comprise:

at least two of a camera simulation model that simulates the operation of a real-world camera sensor, a light detection and ranging (LIDAR) simulation model that simulates the operation of a real-world LIDAR sensor, and a radio detecting and ranging (RADAR) sensor model that simulates the real-world operation of a RADAR sensor.

7. The computer-implemented system of claim 6, wherein the first sensor model comprises the camera simulation model and the second sensor model comprises the LIDAR simulation model, the camera simulation model generating a synthetic image of the synthetic driving scene, and the LIDAR simulation model generating a synthetic LIDAR point cloud of the synthetic driving scene.

8. The computer-implemented system of claim 1, wherein the vehicle compute process further comprises:

determining a perception of the object based on the synthetic sensor data generated based on the low-fidelity mesh data; and determining at least one of a prediction, a path, or a vehicle control based on the perception and the synthetic driving scene.

9. The computer-implemented system of claim 1, wherein the one or more processing units comprises:

at least one central processing unit (CPU), wherein the generating the synthetic sensor data is performed by the CPU, at least one graphical processing unit (GPU), wherein the generating the synthetic driving scene is performed by the GPU.

10. The computer-implemented system of claim 1, wherein the generating the synthetic driving scene is based on data captured from the real-world driving environment.

11. An apparatus comprising:

a computing device comprising one or more processors electrically coupled to a memory subsystem, the memory subsystem comprising transitory memory and non-transitory storage media, the non-transitory storage media including instructions configured to cause the one or more processors to:

render a synthetic driving scene via a scenario simulator comprising a driving scenario model representative of a real-world driving environment, the driving scenario model including a mesh library having 3D meshes representative of real-world objects, the 3D meshes include a set of high-fidelity mesh data and a set of low-fidelity mesh data representing the same 3D objects, wherein the rendering comprises placing a synthetic 3D object in the synthetic driving scene, the synthetic 3D object being based on a high-fidelity mesh from the set of high-fidelity mesh data;

generate first synthetic representation of the synthetic driving scene via a physics-based sensor model configured to simulate the real-world operation of at least a camera sensor and a light detection and ranging (LIDAR) sensor, wherein the physics-based sensor model is configured to generate synthetic sensor data comprising a synthetic camera image of the synthetic object, and synthetic LIDAR data based;

selecting, from the set of low-fidelity mesh data, a low-fidelity mesh representing the synthetic 3D object, wherein the low-fidelity 3D meshes are selected from the set of low-fidelity mesh data based on a sensor simulator processing requirement for the modeled LIDAR sensor compared to a sensor simulator processing requirement of the modeled camera sensor; and operate a physics-based vehicle simulator representative of a real-world vehicle having the at least the camera sensor and the LIDAR sensor, the vehicle simulator being configured to simulate in real-time at least one of an operation or a behavior of the vehicle based on the synthetic riving scene, the synthetic camera image and the synthetic LIDAR data.

12. The apparatus of claim 11, wherein the low-fidelity mesh data includes a smaller number of at least one of vertices, edges, faces, or polygons than the high-fidelity mesh data.

13. The apparatus of claim 12, wherein the smaller number of the at least one vertices, edges, faces, or polygons is based on a configuration parameter.

14. The apparatus of claim 11, wherein a number of vertices in the low-fidelity mesh data is less than 30% of a number of vertices in the high-fidelity mesh data.

15. The apparatus of claim 11, wherein the synthetic driving scene is updated based on the operation or behavior of the vehicle.

16. The apparatus of claim 11, wherein the vehicle simulator simulates the at least one of the operation or the behavior of the vehicle by:

determining at least one of a perception, a prediction, a path, or a control decision based on the synthetic camera image and the synthetic LIDAR data.

17. A computer-implemented method comprising:

defining, via one or more processors electrically coupled to a memory including transitory and non-transitory memory, the non-transitory memory including instructions defining a simulation platform comprising a driving scenario model representative of a real-world driving environment, the driving scenario model including a mesh library having 3D meshes representative of real-world objects, the 3D meshes including a set of high-fidelity mesh data and a set of low-fidelity mesh data representing the same 3D objects, and a vehicle model representative of a real-world vehicle, the vehicle model comprising a set of physics-based sensor models configured to simulate the real-world operation of at least two different real-world sensors having different simulation processing requirements;

generating, via the driving scenario model, a synthetic driving scene including synthetic 3D objects, the synthetic 3D objects being based at least in part on a first mesh data representing an object in a synthetic driving scene obtained from the memory;

generating, via a camera sensor simulation model of the set of physics-based sensor models a synthetic image of the synthetic driving scene based at least in part on the first mesh data; and selecting, from the memory, a second mesh data representing the synthetic 3D object having a lower fidelity than the first mesh data, wherein the second mesh data is selected based on a processing requirement of a light detection and ranging (LIDAR) sensor simulation model compared to the camera sensor simulation model;

generating, via the LIDAR sensor simulation model of the set of physics-based sensor models a synthetic LIDAR point cloud, the synthetic LIDAR point cloud being based on the selected second mesh data; and simulate, via the vehicle model, at least one of an operation or a behavior of the real-world vehicle in the synthetic driving scene based on the synthetic image and the synthetic LIDAR point cloud.

18. The method of claim 17, wherein the second mesh data includes a smaller number of vertices than the first mesh data.

19. The method of claim 17, wherein the obtaining the second mesh data comprises: generating the second mesh data by removing one or more vertices from the first mesh data, the removing based on a parameter.

20. The method of claim 17, wherein the generating the simulation of the at least one of the operation or the behavior of the vehicle comprises:

performing at least one of perception, prediction, path planning, or control based on the image and the LIDAR point cloud.

* * * * *